United States Patent
Liu et al.

(10) Patent No.: US 11,416,650 B2
(45) Date of Patent: Aug. 16, 2022

(54) OPTIMIZED VISUALIZATION OF LOADS AND RESISTANCES FOR WELLBORE TUBULAR DESIGN

(71) Applicant: LANDMARK GRAPHICS CORPORATION, Houston, TX (US)

(72) Inventors: Zhengchun Liu, Sugar Land, TX (US); Robello Samuel, Cypress, TX (US); Adolfo Gonzales, Houston, TX (US); Jenny Xie, Sugar Land, TX (US); Yongfeng Kang, Katy, TX (US)

(73) Assignee: Landmark Graphics Corporation, Houston, TX (US)

( * ) Notice: Subject to any disclaimer, the term of this patent is extended or adjusted under 35 U.S.C. 154(b) by 505 days.

(21) Appl. No.: 15/773,142

(22) PCT Filed: Jun. 16, 2017

(86) PCT No.: PCT/US2017/038010
§ 371 (c)(1),
(2) Date: May 2, 2018

(87) PCT Pub. No.: WO2018/231256
PCT Pub. Date: Dec. 20, 2018

(65) Prior Publication Data
US 2021/0133367 A1    May 6, 2021

(51) Int. Cl.
*G06F 30/20*    (2020.01)
*E21B 17/00*    (2006.01)
(Continued)

(52) U.S. Cl.
CPC .............. *G06F 30/20* (2020.01); *E21B 17/00* (2013.01); *E21B 17/08* (2013.01); *E21B 33/04* (2013.01);
(Continued)

(58) Field of Classification Search
CPC ..... E21B 17/00; E21B 2200/20; E21B 47/007
See application file for complete search history.

(56) References Cited

U.S. PATENT DOCUMENTS 4,972,703 A * 11/1990 Ho ............................ E21B 7/04
73/152.49
7,188,058 B2 * 3/2007 Hardy .................. E21B 47/007
703/2
(Continued)

FOREIGN PATENT DOCUMENTS

EP    1009907 B1    2/2006
EP    2583214 A1    4/2013
(Continued)

OTHER PUBLICATIONS

Zhengchun Liu et al, "The Radial Approach to Safety Factors for Tubular Design", SPE Annual Technical Conference and Exhibition, Dubai, UAE, Paper No. SPE-181459-MS https://doi.org/10.2118/181459-MS Published: Sep. 26, 2016 (Year: 2016).*
(Continued)

*Primary Examiner* — Akash Saxena
(74) *Attorney, Agent, or Firm* — Haynes and Boone, LLP

(57) ABSTRACT

System and methods for optimizing wellbore tubular design are provided. Design parameters for a wellbore tubular component are determined based on different types of axial loads expected during a downhole operation. The design parameters include load conditions at load points along the tubular component. An equivalent axial load is calculated for each load point, based on the corresponding load conditions. Design limits for the different types of axial loads are determined based on associated design parameters. A counter-load pressure is determined for at least one load point selected for each type of axial load, based on the corresponding equivalent axial load for each load point and a corresponding design limit for each type of axial load. At
(Continued)

least one of the design limits is adjusted for the different types of axial loads, based on the counter-load pressure of the selected load point for each type of axial load.

18 Claims, 14 Drawing Sheets

(51) Int. Cl.
  *E21B 17/08* (2006.01)
  *E21B 47/007* (2012.01)
  *E21B 33/04* (2006.01)
  *E21B 43/10* (2006.01)
  *E21B 47/06* (2012.01)
  *G01V 99/00* (2009.01)

(52) U.S. Cl.
  CPC .............. *E21B 43/10* (2013.01); *E21B 47/06* (2013.01); *E21B 47/007* (2020.05); *G01V 99/005* (2013.01)

(56) References Cited

U.S. PATENT DOCUMENTS

| | | | |
|---|---|---|---|
| 7,412,368 B2* | 8/2008 | Mitchell | E21B 17/00 464/18 |
| 7,653,563 B2 | 1/2010 | Veeningen et al. | |
| 8,855,933 B2* | 10/2014 | Mitchell | E21B 47/00 702/9 |
| 9,074,459 B2* | 7/2015 | Mitchell | E21B 47/06 |
| 9,187,965 B2* | 11/2015 | Khemakhem | E21B 19/165 |
| 9,494,710 B2* | 11/2016 | Gonzales | E21B 47/00 |
| 9,638,032 B2* | 5/2017 | Rath | G06F 30/17 |
| 10,018,032 B2* | 7/2018 | Pons | G06F 30/23 |
| 10,161,239 B2* | 12/2018 | Sweatman | E21B 47/06 |
| 10,664,632 B2* | 5/2020 | Gonzales | E21B 43/124 |
| 10,664,633 B2* | 5/2020 | Kang | E21B 43/26 |
| 11,270,048 B2* | 3/2022 | Han | G06F 30/23 |
| 2006/0106588 A1* | 5/2006 | Mitchell | E21B 41/00 703/10 |
| 2008/0035376 A1* | 2/2008 | Freyer | E21B 44/00 175/45 |
| 2011/0186353 A1* | 8/2011 | Turner | G01H 1/003 175/40 |
| 2014/0034390 A1* | 2/2014 | Mitchell | E21B 47/06 175/57 |
| 2014/0039797 A1* | 2/2014 | Gonzales | G01V 99/005 702/11 |
| 2014/0214326 A1* | 7/2014 | Samuel | E21B 47/00 702/11 |
| 2014/0251602 A1* | 9/2014 | Kenison | E21B 44/00 166/250.01 |
| 2015/0012253 A1* | 1/2015 | O'Donnell | G06F 30/20 703/2 |
| 2015/0330204 A1* | 11/2015 | Hildebrand | E21B 44/00 700/282 |
| 2016/0147918 A1* | 5/2016 | Samuel | E21B 17/10 703/2 |
| 2016/0203239 A1* | 7/2016 | Samuel | E21B 43/10 703/1 |
| 2016/0319642 A1 | 11/2016 | Ahmed | |
| 2018/0142536 A1* | 5/2018 | Liu | G06F 30/20 |
| 2018/0230799 A1* | 8/2018 | Coss | E21B 47/16 |
| 2020/0355063 A1* | 11/2020 | Van Vliet | E21B 47/07 |
| 2021/0133367 A1* | 5/2021 | Liu | E21B 43/10 |
| 2022/0106867 A1* | 4/2022 | Kang | E21B 47/007 |

FOREIGN PATENT DOCUMENTS

| | | |
|---|---|---|
| EP | 2870534 A1 | 5/2015 |
| WO | WO-02066921 A2 | 8/2002 |
| WO | WO-2011159307 A1 | 12/2011 |
| WO | WO-2014031186 A1 | 2/2014 |

OTHER PUBLICATIONS

Yunqiang Liu et al, "Analyzing Axial Stress and Deformation of Tubular for Steam Injection Process in Deviated Wells Based on the Varied ( ♦♦, ♦♦ ) Fields", 2013, Hindawi Publishing Corporation, The ScientificWorld Journal vol. 2013, Article ID 565891, 9 pages (Year: 2013).*

M.J. Jellison et al, "Tubing String Design for a 35,000-ft Extended-Reach Well", 21st Annual OTC in Houston, Texas, May 1-4, 1989. . p. 621-630 (Year: 1989).*

Korean Intellectual Property Office, International Search Report and Written Opinion, Mar. 16, 2018, 10 pages, Korea.

* cited by examiner

OPTIMIZED VISUALIZATION OF LOADS AND RESISTANCES FOR WELLBORE TUBULAR DESIGN

CROSS-REFERENCE TO RELATED APPLICATIONS

This application is a U.S. national stage patent application of International Patent Application No. PCT/US2017/038010, filed on Jun. 16, 2017, the benefit of which is claimed and the disclosure of which is incorporated herein by reference in its entirety.

FIELD OF THE DISCLOSURE

The present disclosure relates generally to the field of hydrocarbon recovery from subsurface reservoir formations, and particularly, to wellbore tubular design for hydrocarbon recovery operations performed via wellbores drilled within subsurface reservoir formations.

BACKGROUND

During hydrocarbon recovery operations, tubular sections of a wellbore, e.g., casing or tubing strings disposed within the wellbore, serve as conduits through which hydrocarbons, such as oil and gas, are produced from a subsurface formation to processing facilities at the surface. Therefore, such tubular sections or components of the wellbore must be sufficiently strong to withstand the pressures and stresses associated with fluid flow between the formation and wellbore surface during drilling, production and stimulation operations. In wellbore tubular design, well designers typically need to visualize the design limits, including various loads and resistances, associated with a tubular section of wellbore within a single two-dimensional (2D) plot. For example, such a design limit plot allows well designers to easily check whether any load points of a particular string section lie outside the boundaries of the string's design limits, and thereby determine whether the design can be considered "safe" for use during downhole operations. However, conventional design limit plots provide only an approximation of the design limits, without accounting for many of the actual load conditions that may be present during a hydrocarbon recovery operation.

DESCRIPTION OF ILLUSTRATIVE EMBODIMENTS

Figure 1:
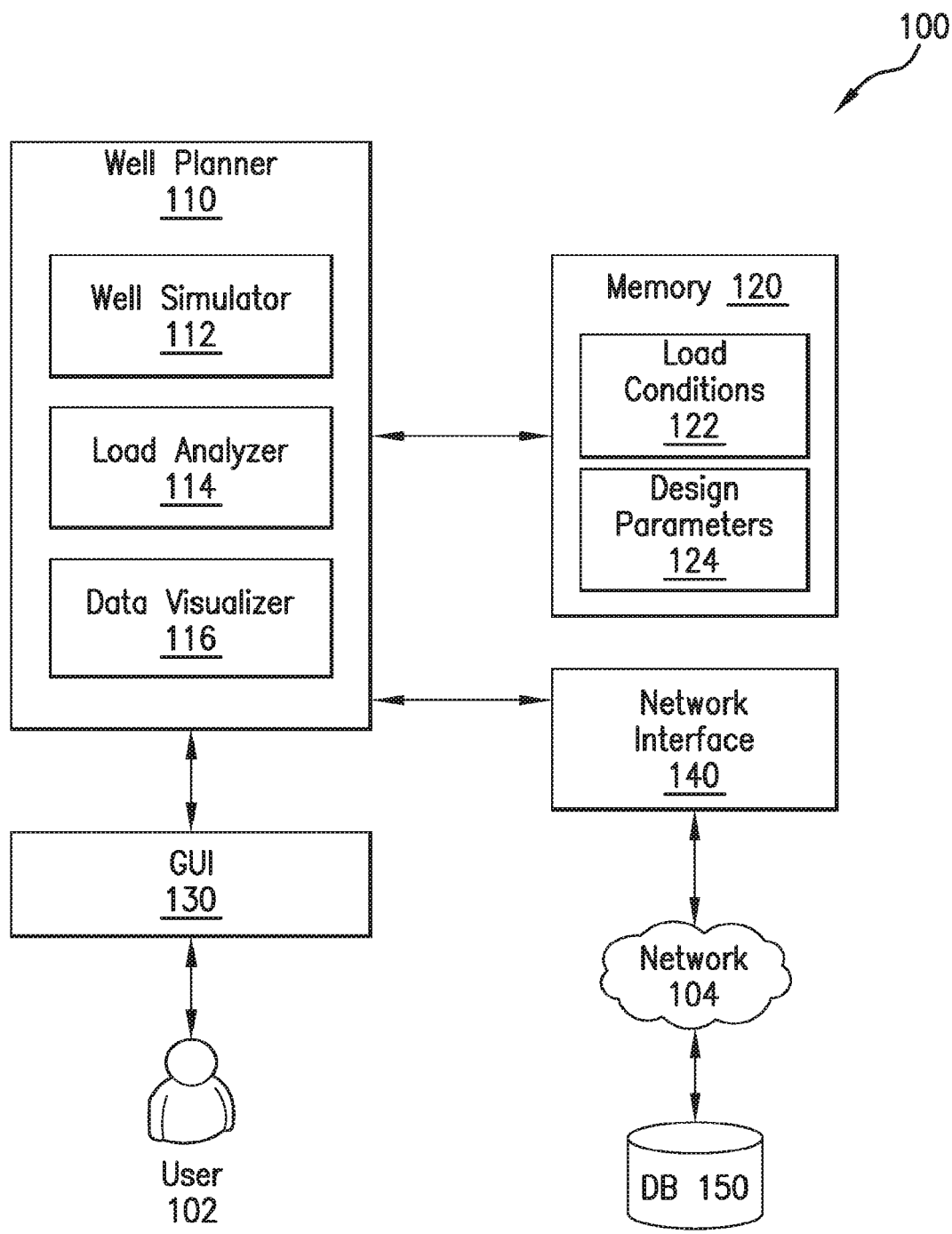
FIG. 1 is a block diagram of an illustrative system for optimizing wellbore tubular design.

Embodiments of the present disclosure relate to optimizing wellbore tubular design. While the present disclosure is described herein with reference to illustrative embodiments for particular applications, it should be understood that embodiments are not limited thereto. Other embodiments are possible, and modifications can be made to the embodiments within the spirit and scope of the teachings herein and additional fields in which the embodiments would be of significant utility. Further, when a particular feature, structure, or characteristic is described in connection with an embodiment, it is submitted that it is within the knowledge of one skilled in the relevant art to implement such feature, structure, or characteristic in connection with other embodiments whether or not explicitly described.

It would also be apparent to one of skill in the relevant art that the embodiments, as described herein, can be implemented in many different embodiments of software, hardware, firmware, and/or the entities illustrated in the figures. Any actual software code with the specialized control of hardware to implement embodiments is not limiting of the detailed description. Thus, the operational behavior of embodiments will be described with the understanding that modifications and variations of the embodiments are possible, given the level of detail presented herein.

In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

The terms "tubular component", "wellbore tubular component" and "wellbore tubular" are used interchangeably herein to refer broadly and inclusively to any tubular element or structural component of a wellbore. For example, such a tubular component may be a segment of pipe (or pipe body) used for transporting fluids, e.g., oil or gas, between a subsurface reservoir formation and the surface of the wellbore during hydrocarbon recovery operations. Alternatively, the tubular component may be a connector, e.g., a coupling, joint or valve assembly, between different pipe segments. A pipe segment may correspond to, for example, a portion of a casing string or a tubing string located along one or more sections of the wellbore. It should be appreciated that such tubular components may be disposed within the wellbore itself, e.g., production casing within a downhole section of the wellbore, or located at the surface of the wellbore, e.g., a wellhead. Thus, while embodiments of the present disclosure may be described in the context of hydrocarbon recovery operations performed downhole, it should be appreciated that the wellbore tubular design techniques disclosed herein are not intended to be limited to only downhole tubular components and that these techniques may be applied to the design of both downhole and surface tubular components of the wellbore.

As will be described in further detail below, embodiments of the present disclosure may be used to determine appropriate design limits for tubular components of a wellbore for downhole operations to be performed along the wellbore. Such operations may include, for example, drilling, completion, production, workover, stimulation and other operations related to the recovery of hydrocarbon deposits from a subsurface reservoir formation. In one or more embodiments, the design of a tubular component of the wellbore may involve formulating a set of load scenarios expected during such a downhole operation and checking whether or not the load scenarios are within a design limit or minimum allowable safety margin for a particular type of load, based on the component's load capacity and resistance to failure under that type of load. Each load scenario may represent a combination of various design parameters for a particular type of load at various load points along the tubular component. Examples of such design parameters include, but are not limited to, material properties (e.g., pipe grade), load conditions, and physical dimensions (e.g., pipe size) of the tubular component. Load conditions may include, but are not limited to, internal and external pressures, axial and/or torsional forces, torque, and bending momentum as a function of depth. Examples of different types of loads that may be considered for a particular design of the tubular component include, but are not limited to, axial, burst, collapse, and triaxial loads.

In one or more embodiments, a graphical representation of the load scenarios and design limits for a tubular component may be generated and presented to a user (e.g., a well designer) as part of a workflow for designing a wellbore or tubular component thereof. For example, the graphical representation of load scenarios and design limits may be visualized as a two-dimensional (2D) plot graph (or "design limit plot") on a display of the user's computing device. The user in this example may use such a design limit plot to compare the load points associated with each load scenario represented in the plot with strength or yield envelopes corresponding to the design limits for different types of loads. However, it should be appreciated that the comparison between load points and design limits for the tubular component may be performed automatically without any user intervention. If all load points are determined to be within the design limits of the tubular component (e.g., located within each of the corresponding yield envelopes as shown in the design limit plot), the wellbore tubular design may be considered "safe" for use during the downhole operation.

In one or more embodiments, an equivalent axial load may be calculated for each of a plurality of load points along the tubular component based on the corresponding load conditions at that point. The equivalent axial load for a load point along the tubular component may be defined as the sum of the axial load and a counter-load pressure for a cross-sectional area of the tubular component corresponding to the load point. As used herein, the term "counter-load pressure" refers to the minimum of either the internal pressure (Pi) or external pressure (Po), expressed as min(Pi, Po), at a particular load point. As will be described in further detail below, the equivalent axial load and counter-load pressure may be used to determine design limits for the plurality of load points along the tubular component. By using the equivalent axial load and counter-load pressure, the disclosed tubular design techniques may provide the following advantages over conventional techniques, which use true axial force and effective differential pressure to approximate the yield envelope for wellbore tubular components: (1) more accurate visualization of the relationship between loads and resistances; (2) determination of triaxial yield envelopes that are more consistent with strength envelopes based on industry standard models, e.g., according to the American Petroleum Institute (API) 5C3 or International Organization for Standardization (ISO) 10400 standards; and (3) more accurate calculation of safety factors for tubular components, such as casing/tubing connectors with user-specified strength envelopes. The "safety factor" for a tubular component may be defined as a ratio of the component's resistance to its load. The safety factor for a wellbore tubular design may therefore provide a measure of the reliability of the particular design.

Illustrative embodiments and related methodologies of the present disclosure are described below in reference to FIGS. 1-12 as they might be employed, for example, in a computer system for the design and implementation of wellbore tubular components as part of an overall well plan for a downhole operation to be performed along different sections of a wellbore within a subsurface formation. For example, such a computer system may be used to visualize design limits for different load points of a tubular component of the wellbore during a design phase of the operation to be performed along a current section of the wellbore. The computer system may also be used to make appropriate adjustments to the design limits. Such adjustments may also be used to adjust a current design of the tubular component for subsequent sections of the wellbore during an implementation phase of the operation. Other features and advantages of the disclosed embodiments will be or will become apparent to one of ordinary skill in the art upon examination of the following figures and detailed description. It is intended that all such additional features and advantages be included within the scope of the disclosed embodiments. Further, the illustrated figures are only exemplary and are not intended to assert or imply any limitation with regard to the environment, architecture, design, or process in which different embodiments may be implemented.

FIG. 1 is a block diagram of an illustrative system 100 for well planning and design. System 100 may be used, for example, to optimize design limits for tubular components of a wellbore for a downhole operation to be performed along the wellbore. As shown in FIG. 1, system 100 includes a well planner 110, a memory 120, a graphical user interface (GUI) 130, and a network interface 140. In one or more embodiments, well planner 110, memory 120, GUI 130, and network interface 140 may be communicatively coupled to one another via an internal bus of system 100. Although only well planner 110, memory 120, GUI 130, and network interface 140 are shown in FIG. 1, it should be appreciated that system 100 may include additional components and sub-components as desired for a particular implementation.

It should be appreciated that well planner 110 and its components, including well simulator 112, load analyzer 114, and data visualizer 116, may be implemented in software, firmware, hardware, or any combination thereof. For example, well planner 110, well simulator 112, load analyzer 114, and data visualizer 116 may be implemented as components of a well planning and design application executable at system 100. Furthermore, it should be appreciated that embodiments of well planner 110, well simulator 112, load analyzer 114, and data visualizer 116, or portions thereof, can be implemented to run on any type of processing device including, but not limited to, a computer, workstation, embedded system, networked device, mobile device, or other type of processor or computer system capable of carrying out the functionality described herein.

Accordingly, system 100 may be implemented using any type of computing device having at least one processor and a processor-readable storage medium for storing data and instructions executable by the processor. Examples of such a computing device include, but are not limited to, a mobile phone, a personal digital assistant (PDA), a tablet computer, a laptop computer, a desktop computer, a workstation, a server, a cluster of computers, a set-top box, or other type of computing device. Such a computing device may also include an input/output (I/O) interface for receiving input or commands from a user 102 via a user input device (not shown). The user input device may be, for example and without limitation, a mouse, a QWERTY or T9 keyboard, a touch-screen, a graphics tablet, or a microphone. The I/O interface also may be used by the computing device to output or present information via an output device (not shown). The output device may be, for example, a display coupled to or integrated with the computing device for displaying a digital representation of the information being presented to user 102. The i/O interface in the example shown in FIG. 1 may be coupled to GUI 130 for receiving input from user 102 and displaying information and content to user 102 based on the received input. GUI 130 can be any type of GUI display coupled to system 100.

Memory 120 may be used to store information accessible by well planner 110 and any of its components for implementing the functionality of the present disclosure. Memory 120 may be any type of recording medium coupled to an integrated circuit that controls access to the recording medium. The recording medium can be, for example and without limitation, a semiconductor memory, a hard disk, or similar type of memory or storage device. In some implementations, memory 120 may be a remote data store, e.g., a cloud-based storage location, communicatively coupled to system 100 over a network 104 via network interface 140. Network 104 can be any type of network or combination of networks used to communicate information between different computing devices. Network 104 can include, but is not limited to, a wired (e.g., Ethernet) or a wireless (e.g., Wi-Fi or mobile telecommunications) network. In addition, network 104 can include, but is not limited to, a local area network, medium area network, and/or wide area network such as the Internet.

In one or more embodiments, well planner 110 may include a well simulator 112, a load analyzer 114, and a data visualizer 116. Well simulator 112 may be used to simulate a downhole operation along one or more sections of the wellbore. In one or more embodiments, the simulation performed by well simulator 112 may include simulating fluid flow along a tubular component of the wellbore. The results of the simulation may be then be used to determine a set of load conditions 122 at each of a plurality of load points along the tubular component. Load conditions 122 may include, for example and without limitation, an axial load, an internal pressure, and an external pressure at each load point. As shown in FIG. 1, load conditions 122 may be stored in memory 120.

Additionally or alternatively, one or more of load conditions 122 (e.g., one or more of axial load, internal pressure, and external pressure) may be determined based on input received from user 102 via GUI 130. For example, user 102 may use a user input device (not shown) coupled to system 100 to specify values for one or more of input parameters 122 via UI control elements (e.g., text fields) displayed within GUI 130.

In some implementations, load conditions 122 may be stored within memory 120 after being retrieved from a remote data store or database (DB) 150 via network interface 140 and network 104. DB 150 may be any remote data storage device or system used to store any of various types of information accessible by well planner 110 and its components via network interface 140 and network 104 for performing the techniques disclosed herein. For example, DB 150 may be a materials property database that stores information related to the material or physical properties of different types of tubular components, e.g., tubing and casing strings.

In one or more embodiments, load analyzer 114 may retrieve load conditions 122 from memory 120 for the plurality of load points along the tubular component. Load analyzer 114 may then determine appropriate design limits for the plurality of load points along the tubular component of the wellbore. The design limits may include, for example, a compression limit and a tension limit for the load points along the tubular component of the wellbore. The load points may be associated with a particular load scenario expected for the wellbore tubular design under consideration in this example. Further, the load scenario may be one of a plurality of load scenarios expected along the tubular component of the wellbore. As described above, each load scenario may be a combination of various design parameters (e.g., selected from design parameters 124) associated with the particular tubular component.

In one or more embodiments, load analyzer 114 may initialize the compression and tension limits for compression and tension loads along the tubular component, based on design parameters 124 associated with the tubular component. Design parameters 124 may include, for example, an axial rating and one or more design factors (e.g., an axial tension design factor and an axial compression design factor) associated with the tubular component. The axial rating may for the tubular component may be calculated based on industry standard formulas, e.g., formulas published as part of the American Petroleum Institute (API) 5C3 or International Organization for Standardization (ISO) 10400 standards. In one or more embodiments, design parameters 124 may be retrieved from a materials property database, e.g., DB 150, via network interface 140 and 104. As shown in FIG. 1, design parameters 124 may be stored in memory 120 alongside load conditions 122 for the tubular component. Together, load conditions 122 and design parameters 124 may represent input parameters for load analyzer 114 to determine appropriate design limits (compression and tension limits) for the tubular component.

However, the initial compression and tension limits in this example may be based on an axial load, which does not take into account the internal or external pressures at the load points along the tubular component. In one or more embodiments, load analyzer 114 may calculate an equivalent axial load for each load point based on the corresponding load conditions 122. As will be described in further detail below, the equivalent axial load for a load point along the tubular component may be defined as the sum of the axial load and a counter-load pressure multiplied by a cross-sectional area of the tubular component corresponding to the load point. As the equivalent axial load for each load point is a pressure-dependent value, load analyzer 114 may use the equivalent axial load calculated for each load point to adjust the compression and tension limits accordingly.

In one or more embodiments, the compression and tension limits may be adjusted based on appropriate values of the counter-load pressure for axial tensile and compressive loads at selected loads along the tubular component. For example, load analyzer 114 may perform a search to find appropriate counter-load pressure values that may be used with corresponding values of the equivalent axial load to represent pressure-adjusted compression and tension limits for the load points along the tubular component. Thus, an appropriate counter-load pressure value may be determined for a "compressive equivalent axial load" to determine a pressure-adjusted compression limit for the load points along the tubular component. Similarly, another counter-load pressure value may be determined for a "tensile equivalent axial load" to determine a pressure-adjusted tension limit for the load points along the tubular component. The counter-load pressure values and corresponding values of the tensile equivalent axial load and the compressive equivalent axial load in this example may be used to adjust or update the initial compression and tension limits for the load points along the tubular component.

In one or more embodiments, data visualizer 116 may display a visualization of the above-described design limits for the plurality of load points via GUI 130. The load points may be, for example, associated with at least one of a plurality of load scenarios formulated for different types of downhole operations. Examples of such downhole operations include, but are not limited to, drilling, production, and stimulation operations. In one or more embodiments, the visualization may be a plot graph (or "design limit plot") including a graphical representation of the load points relative to the design limits and yield envelope for the tubular component. Examples of such a design limit plot are shown in FIGS. 2-6, as will be described in further detail below.

Figure 2:
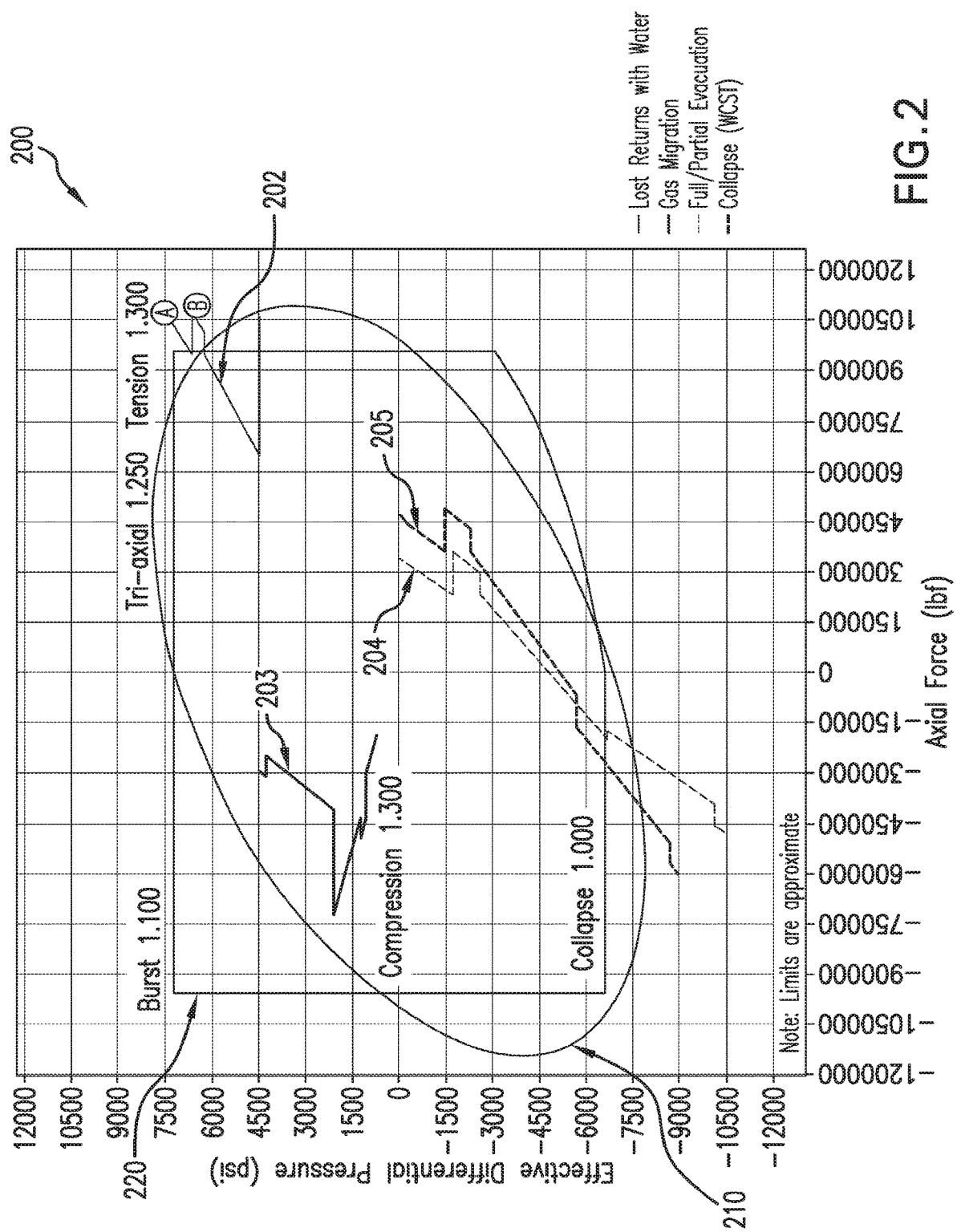
FIG. 2 is a design limit plot of different load scenarios and design limits for a tubular component of a wellbore

FIG. 2 is a design limit plot 200 of different load scenarios and design limits for a tubular component of a wellbore. As shown in FIG. 2, different load lines within design limit plot 200 may be used to represent a plurality of load scenarios 202, 203, 204 and 205 for a particular tubular component design under consideration. As described above, each load scenario may represent a different combination of design parameters for a particular type of load at various load points along the tubular component. Examples of such design parameters include, but are not limited to, material properties, load conditions, and dimensions of the tubular component.

The x-axis of design limit plot 200 as shown in FIG. 2 is used to represent axial force and the y-axis is used to represent effective differential pressure. However, it should be appreciated that embodiments are not intended to be limited thereto. The effective differential pressure (ΔPe) may be determined using, for example, Equations (1) and (2) for burst loads and collapse loads, respectively:

$$\Delta Pe = Pi - Po \quad (1)$$

$$\Delta Pe = Pi - Po - 2t/D \cdot Pi \quad (2)$$

To evaluate the yield strength of the tubular component design under combined loading conditions, load scenarios 202, 203, 204 and 205 may be compared to a triaxial yield envelope 210 in addition to an API yield envelope 220. For example, as the load points labeled "A" and "B" are located outside of triaxial yield envelope 210 and API yield envelope 220 in design limit plot 200, the corresponding load conditions at these points may be considered "unsafe" for the design of the particular tubular component in this example. Such unsafe load points may indicate points of yield failure, where the triaxial stress due to the expected load conditions exceeds the yield strength of the tubular component design. While only load points A and B associated with load scenario 202 are shown in FIG. 2, it should be appreciated that load points associated with other load scenarios also may be shown as part of the visualization included with design limit plot 200, e.g., as displayed via GUI 130 of FIG. 1, as described above.

In one or more embodiments, triaxial yield envelope 210 may represent a minimum allowable margin of safety that is required for a design of the tubular component to avoid failure under triaxial loads expected during the downhole operation. Triaxial yield envelope 210 may be based on one or more design factors (e.g., design factors 124 of FIG. 1, as described above) and triaxial ratings for burst and collapse loads. The design factors may represent, for example, minimum allowable safety factors for burst and collapse loads that the tubular component is expected to withstand during the downhole operation. The value of such a design factor may account for uncertainties in design parameters affecting the collapse resistance and strength of the tubular component's structure. In some implementations, the value of the design factor may be determined based on a model of the load conditions and resistance. Such a model may be generated based on historical data of the loads and resistance associated with wellbore tubular designs used in prior hydrocarbon recovery operations.

In one or more embodiments, API yield envelope 220 may represent a combination of the following design limits: an axial tension limit; an axial compression limit; an API burst limit; and an API collapse limit. The API collapse limit may be based on an API collapse formula that already accounts for internal pressure. Likewise, the API burst limit may be independent of axial force and external pressure. Therefore, no adjustments to these API design limits or API yield envelope 220 are needed to account for any additional pressure effects on the tubular component design under consideration.

By contrast, the triaxial burst ratings and triaxial collapse ratings associated with triaxial yield envelope 210 may be dependent upon external pressure and internal pressure, respectively. Therefore, adjustments to triaxial yield envelope 210 may be needed to effectively account for the effects of such counter-load pressures. For example, assuming a von Mises yield criterion with zero torsional stress, the addition of internal and external pressures may cause triaxial yield envelope 210 to shift along one or more axes of design limit plot 200, as shown in FIG. 3.

Figure 3:
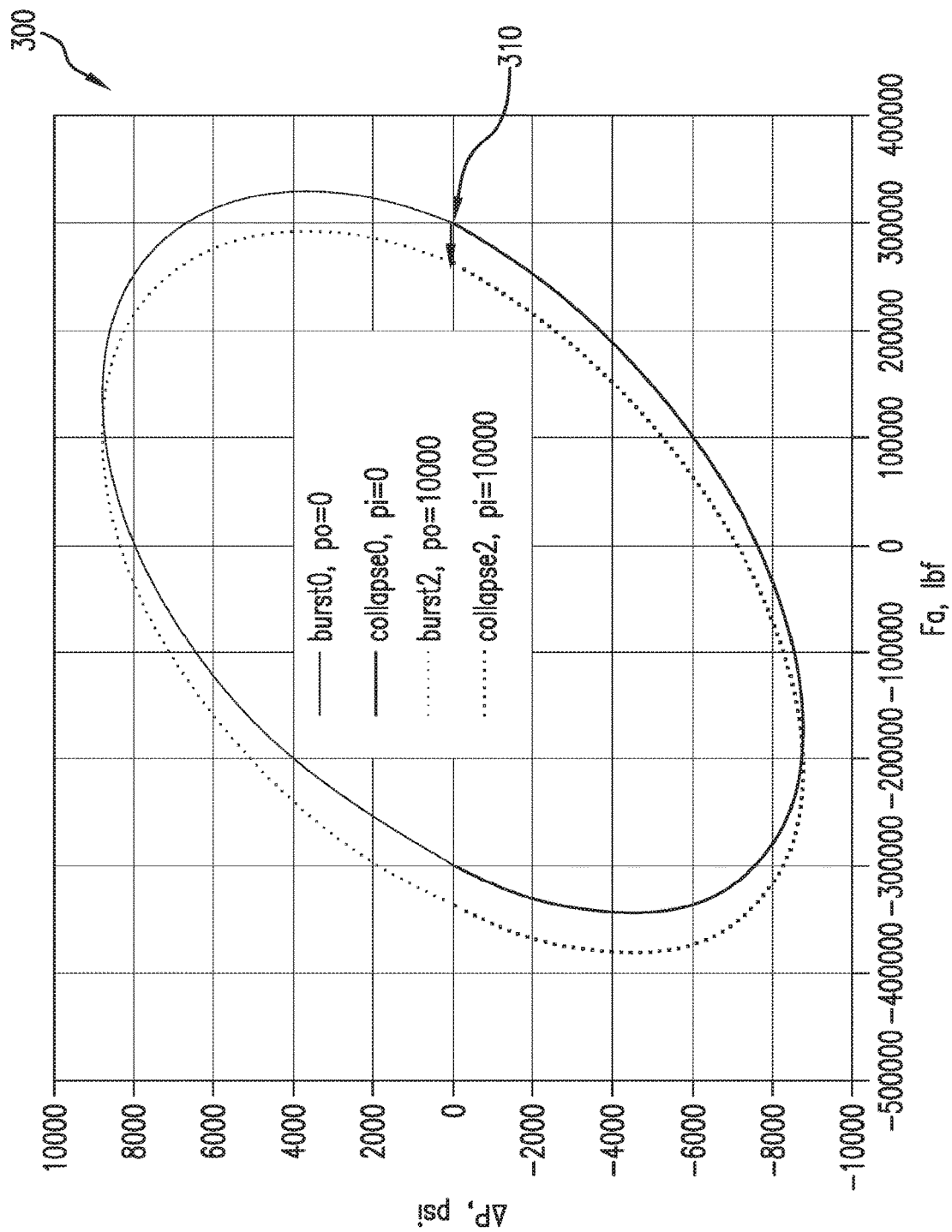
FIG. 3 is a design limit plot showing an example of a shifting triaxial yield envelope due to counter-load pressures.

FIG. 3 is a design limit plot 300 showing an example of a triaxial yield envelope 310 shifting along the x-axis due to internal ($P_i$) and external ($P_o$) counter-load pressures. In one or more embodiments, the degree to which triaxial yield envelope 310 shifts may be based on von Mises criteria for the material yield strength of the tubular component, as expressed by Equations (3) and (4), respectively:

$$YS^2 = (\sigma_z + P_i)^2 - j(\sigma_z + P_i)\Delta P + j^2 \Delta P^2 \quad (3)$$

$$YS^2 = (\sigma_z + P_i)^2 + (2-j)(\sigma_z + P_i)\Delta P + (1-j+j^2)\Delta P^2 \quad (4)$$

where YS is yield strength, $\sigma_z$ is axial stress, $\Delta P(=P_i-P_o)$ is the critical differential pressure, $j=2A_o/(A_o-A_i)$ (where $A_o$ is external circle area and $A_i$ is internal circle area), and where Equation (3) is used for cases in which $P_i<P_o$, and Equation (4) is used for cases in which $P_i>P_o$.

Referring back to FIG. 2, triaxial yield envelope 210 may provide only an approximation of the actual triaxial envelope for the tubular component, as the influence of counter-load pressure is not taken into account when plotting true axial force along the x-axis as in plot graph 200. The resulting inconsistency becomes significant with larger values of the counter-load pressure, e.g., values of internal pressure ($P_i$) greater than 10000 psi. Also, as the effective differential pressure for burst loads and collapse loads are determined in different ways, e.g., using Equation (1) and Equation (2), respectively, values of the effective differential pressure plotted along the y-axis of design limit plot 200 for burst loads may be inconsistent with those for collapse loads.

In one or more embodiments, such inconsistencies may be resolved in part by using an equivalent axial load in place of axial force for the x-axis. In one or more embodiments, the equivalent axial load (Feq) may be determined using Equation (5) as follows:

$$Feq = Fa + \min(P_i, P_o) \cdot As, \quad (5)$$

where Fa is axial force (or "axial load"), $P_i$ is internal pressure, $P_o$ is outer or external pressure, and As is the cross-sectional area of the tubular component corresponding to one or more load points. The cross-sectional area (As) may be determined using Equation (6) as follows:

$$As = Ao - Ai \quad (6)$$

where Ao is the cross-sectional area based on an outer diameter of the tubular component and Ai is the cross-sectional area based on an inner diameter of the tubular component.

Equation (5) above for the equivalent axial load may be based on an equivalent axial stress ($\sigma_{eq}$) for triaxial collapse and burst ratings, as expressed using Equations (7) and (8), respectively:

$$\sigma_{eq} = \sigma_a + P_i \quad (7)$$

$$\sigma_{eq} = \sigma_a + P_o \quad (8)$$

where $\sigma_a$ is a component of axial stress that is not due to bending and as described above, Po and Pi are external pressure and internal pressure, respectively.

In addition to using equivalent axial load for the x-axis, differential pressure may be used in place of effective differential pressure for the y-axis. This is consistent with the API collapse rating formula according to the 2015 Addendum to the API 5C3 standards, in which effective differential pressure is replaced by differential pressure and internal pressure (Pi) is treated as equivalent axial stress. The API collapse rating formula may be as expressed using Equation (9):

$$f_{ycom} = \left\{\left[1 - 0.75\left(\frac{(\sigma_a + P_i)}{f_{ymn}}\right)^2\right]^{\frac{1}{2}} - 0.5\left(\frac{(\sigma_a + P_i)}{f_{ymn}}\right)\right\} f_{ymn} \quad (9)$$

(for $\sigma_a + P_i \geq 0$)

where fycom is the combined loading equivalent grade, the equivalent yield strength in the presence of axial stress and internal pressure; fymn is the specified minimum yield strength; aa is the component of axial stress not due to bending; pi is the internal pressure; pc is the collapse resistance.

A design limit plot with equivalent axial load as the x-axis and differential pressure as the y-axis allows both internal and external pressures to be taken into account when plotting the triaxial yield envelope. Accordingly, such a design limit plot also allows the triaxial yield envelope for collapse and burst loads, e.g., based on Equations (7) and (8), respectively, to be consistent with the collapse and burst limits of the API yield envelope, e.g., based on Equations (3) and (4), respectively. An example of such a plot is shown in FIG. 4.

Figure 4:
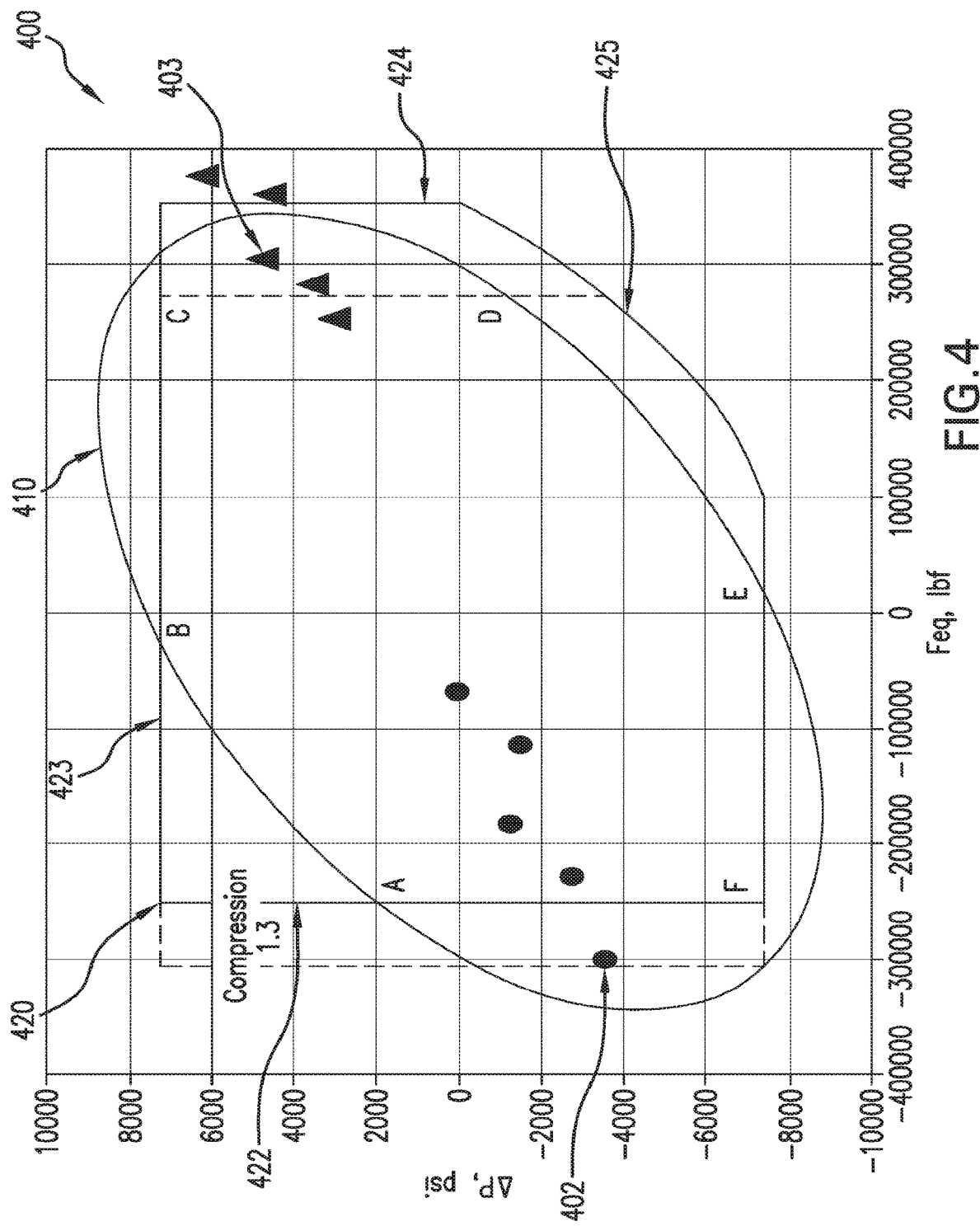
FIG. 4 is a design limit plot of equivalent axial load (Feq) versus differential pressure (ΔP) for different sets of load points relative to API and triaxial yield envelopes.

FIG. 4 is a design limit plot 400 of equivalent axial load (Feq) versus differential pressure ($\Delta P$) for different sets of load points relative to API and triaxial yield envelopes. As shown in FIG. 4, a load point 402 may be one of a plurality of load points associated with a particular load scenario under consideration for the tubular component of the wellbore in this example. Likewise, a load point 403 may be one of a plurality of load points associated with a different load scenario for the tubular component. The load points in plot 400 are shown relative to a triaxial yield envelope 410 and an API yield envelope 420. API yield envelope 420 may be composed of four parts: an axial compression limit 422, an axial tension limit 424, an API burst limit 423, and an API collapse limit 425. As described above, API collapse limit 425 already accounts for the effects of internal pressure and API burst limit 423 is independent of axial force and external pressure. Therefore, no adjustment is necessary for API burst limit 423 and API collapse limit 425. However, adjustments to axial compression limit 422 and axial tension limit 424 may be needed in order to maintain consistency between triaxial yield envelope 410 and API yield envelope 420 and thereby, allow proper comparisons to be made between these yield envelopes using design limit plot 400.

In conventional design limit plots with axial force as the x-axis, the tension and compression limits for true axial force are typically determined using Equations (10) and (11), respectively, as follows:

$$Fa1 = Fy/DF1 \quad (10)$$

$$Fa2 = -Fy/DF2 \quad (11)$$

where Fa1 and Fa2 represent the tension and compression limits for axial force, respectively, Fy is an axial rating of the tubular component, DF1 is an axial tension design factor and DF2 is an axial compression design factor. However, it should be appreciated that, in some implementations, the same design factor may be used for both tensile and compressive axial loads.

By contrast, equivalent axial load (Feq) replaces axial force in the design limit plots (e.g., design limit plot 400) generated using the techniques disclosed herein and as described above, values of the equivalent axial load (according to Equation (5) above) are pressure-dependent. In one or more embodiments, a counter-load pressure may be used to compensate for the effects of internal and external pressures on the equivalent axial load. For example, appropriate values of the counter-load pressure may be determined so that corresponding values of the equivalent axial load may be used to effectively represent pressure-adjusted tension and compression limits within design limit plot 400. Accordingly, the adjusted tension and compression limits provide a way to correctly display uniaxial design limits within a triaxial design limit plot.

In one or more embodiments, values of an equivalent axial load (Feq1) representing a pressure-adjusted tension limit may be determined based on values of a counter-load pressure (P1) and a cross-sectional area (As) of the tubular component, as expressed by Equation (12):

$$Feq1=Fy/DF1+P1*As \qquad (12)$$

Likewise, values of an equivalent axial load (Feq2) representing a pressure-adjusted compression limit may be determined based on values of a counter-load pressure (P2) and the tubular cross-sectional area (As), as expressed by Equation (13):

$$Feq2=Fy/DF2+P2*As \qquad (13)$$

In one or more embodiments, appropriate values of P1 and P2 may be determined based on a search of corresponding pressure values at selected load points along the tubular component. The selection criteria for load points and pressure values used to adjust the axial compression and tension limits in this example may include: (1) all "unsafe" load points (e.g., load points at which an axial safety factor (SF) is less than or equal to DF1 or DF2) must be located outside the API yield envelope; and (2) for all "safe" load points, the relative distance between the load points and axial limits along the x-axis of design limit plot 400 should change as little as possible. An example of a workflow for performing such a search will be described in further detail below with respect to FIG. 8.

As shown in FIG. 4, the dotted lines in design limit plot 400 may represent the initial compression limit 422 and the initial tension limit 424, prior to being adjusted according to the appropriate counter-load pressure values determined for each limit. Based on the adjusted limits, a safe design for the tubular component in this example may be one in which all load points fall within the innermost envelope defined by points A-B-C-D-E-F-A. While uniaxial design limits are shown together with triaxial design limits in design limit plot 400, it should be appreciated that embodiments are not limited thereto. For example, in some implementations, the design limit plot may include separate content areas for visualizing uniaxial and triaxial design limits, as shown in FIG. 5.

Figure 5:
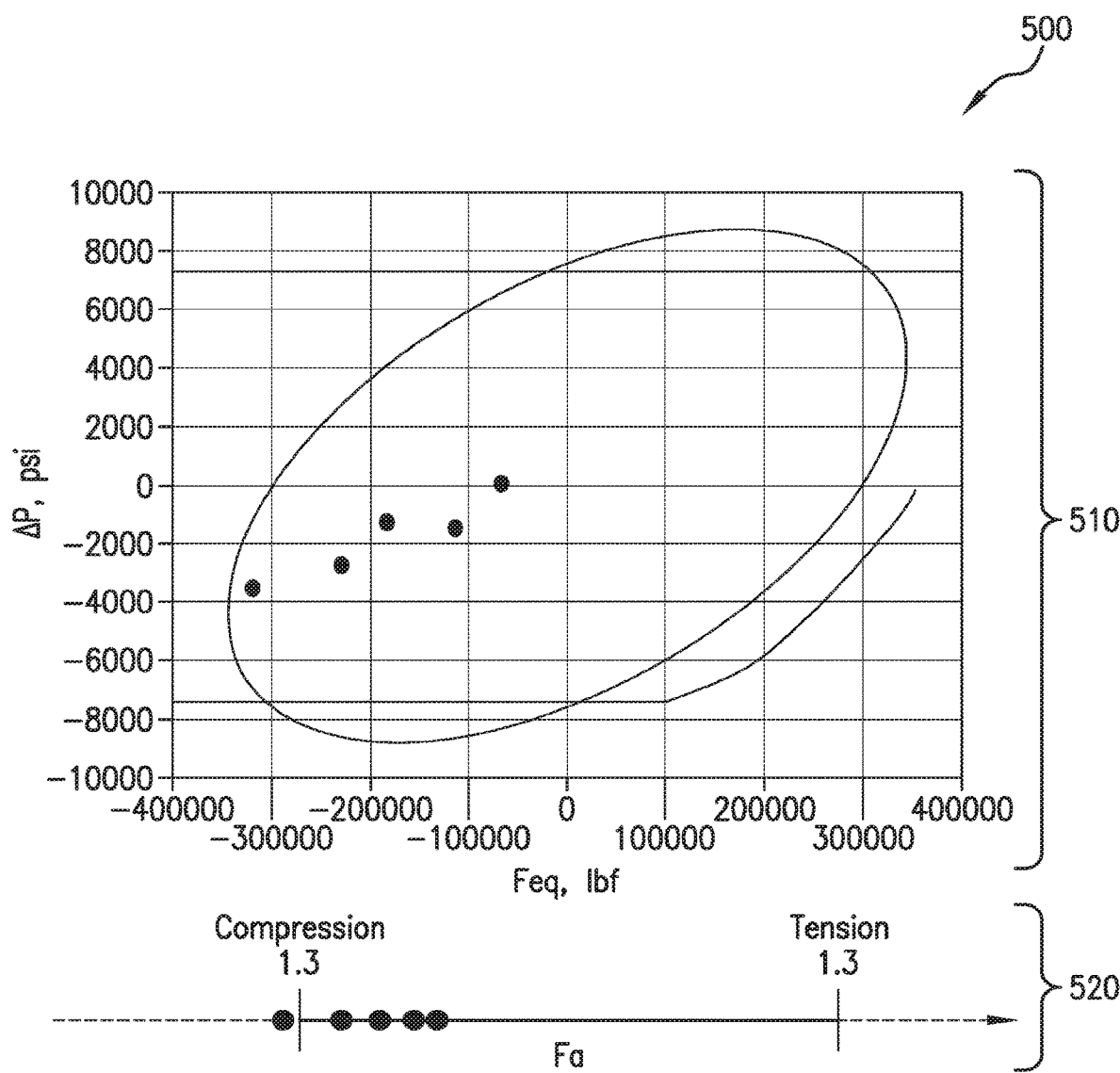
FIG. 5 is a design limit plot illustrating an example of visualizing uniaxial design limits separately from triaxial design limits.

FIG. 5 is an example of a design limit plot 500 including a content area 510 for displaying triaxial design limits and a separate content area 520 for displaying uniaxial design limits for a set of load points along a wellbore tubular component. In one or more embodiments, design limit plot 500 may be displayed via a GUI (e.g., GUI 130 of FIG. 1, as described above) of a well planning and design application executable at a computing device or system (e.g., system 100 of FIG. 1, as described above) of a user, e.g., a well designer. Such a GUI may provide various controls for the user to switch between different views of the design limit plot and design limits therein. For example, the GUI may provide controls enabling the user to switch between the separate view of uniaxial and triaxial design limits as shown in design limit plot 500 and a combined view of these design limits as shown in design limit plot 400 of FIG. 4, as described above. The GUI may also provide controls, e.g., via a user control menu or dialog window, for switching between different views showing pressure-adjusted axial design limits, the initial design limits only, or both the initial and adjusted limits. It should be appreciated that any number of additional controls may be provided for controlling or customizing different visual aspects of the design limit plot and design limit visualizations displayed therein, as desired for a particular implementation. Such a design limit plot allows the user or well designer to easily check if all axial loads are within the tension/compression limits for a particular tubular component design under consideration, where such axial limits have been appropriately adjusted or optimized based on a pressure-dependent equivalent axial load.

While the design limit plot examples in FIGS. 2-5 are described in the context of axial loads at load points along a tubular component of a wellbore, it should be appreciated that the disclosed tubular design techniques are not intended to be limited thereto and that the these techniques may also be used to determine and visualize pressure-adjusted or optimal design limits for axial loads at connection points between different segments of the tubular component, as will be described with respect to the example illustrated in FIG. 2.

Figure 6:
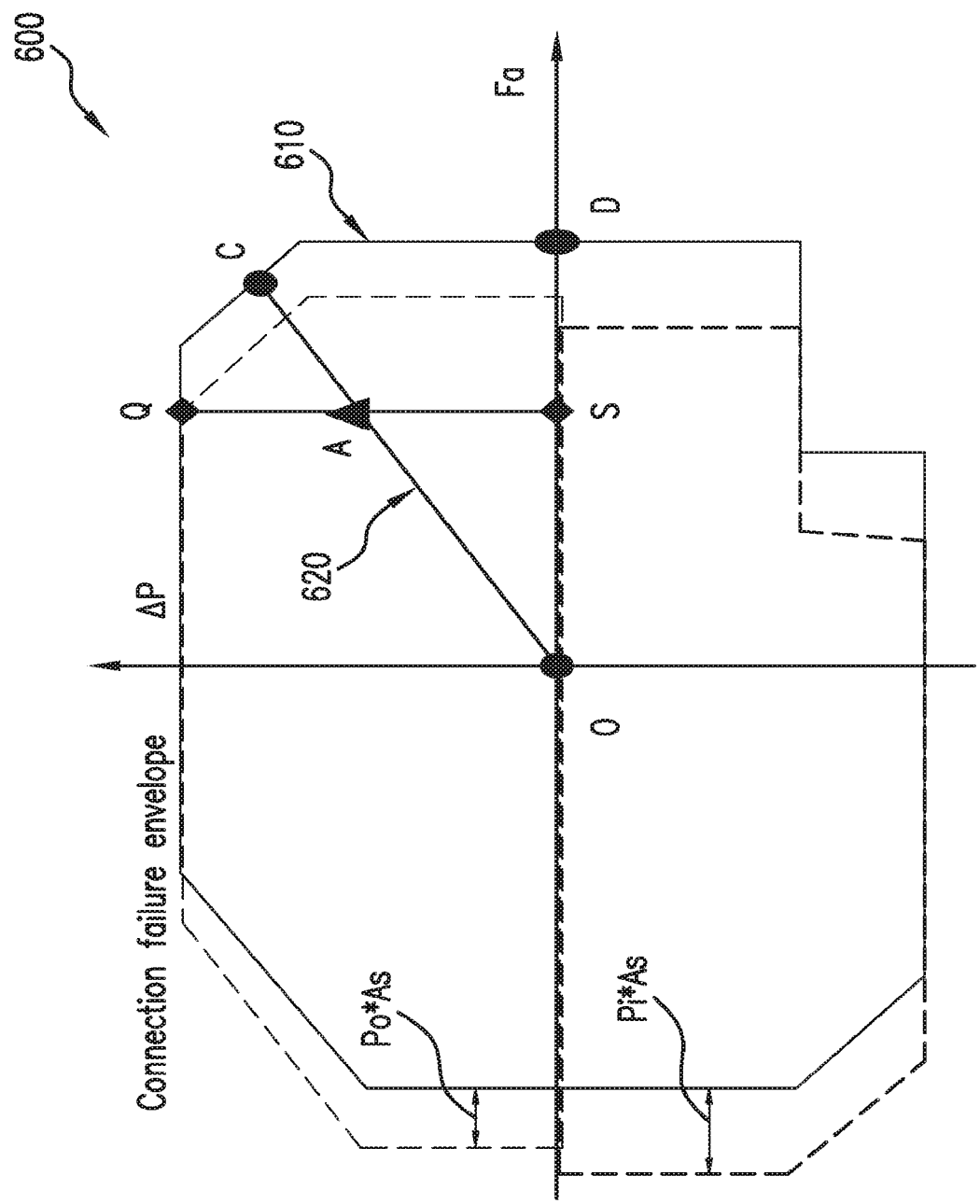
FIG. 6 is a design limit plot illustrating adjustments to a connection failure envelope based on different types of counter-load pressures.

FIG. 6 is a design limit plot 600 of an illustrative axial load (Fa) relative to differential pressure (ΔP) for a load point A corresponding to a connection between different segments of a wellbore tubular component. The different segments may be segments of a pipe, e.g., a casing or tubing string, disposed within the wellbore. Load point A may correspond to, for example, a point on a coupling, valve or other type of connector between the pipe segments. Similar to the load points that are shown relative to triaxial yield envelope 410 in design limit plot 400 of FIG. 4, as described above, load point A is shown within design limit plot 600 relative to a connection failure envelope 610. Although connection failure envelope 610 is shown using a polygonal shape that differs from the curved shape of triaxial yield envelope 410, connection failure envelope 610 may also represent a triaxial yield envelope for triaxial loads expected for the design of the tubular component under downhole conditions. However, the triaxial loads in this example may be triaxial stresses expected for a pipe connector under such load conditions. As described above, such load conditions may be associated with a particular load scenario being analyzed for the wellbore tubular design.

As connection failure envelope 610 and strength envelopes of ISO connectors generally are similar to the triaxial yield envelopes used for segments of a pipe body, a similar shift in the position of connection failure envelope 610 to that described above with respect to triaxial yield envelope 310 of FIG. 3 may be expected. Thus, like triaxial yield envelope 310, internal and external pressures may cause connection failure envelope 610 to shift along the x-axis of design limit plot 600. As shown by the dotted lines in FIG. 6, portions of connection failure envelope 610 above and below the x-axis of design limit plot 600 in this example may shift in different ways depending on the amount of internal and external pressures.

Accordingly, to ensure that connection failure envelope 610 as shown in design limit plot 600 also accounts for such counter-load pressures expected for the pipe connector design in this example, equivalent axial load may be used in place of axial force for the x-axis. This is allows connection failure envelope 610 as plotted within design limit plot 600 to accurately represent the effects of both loads and counter-load pressures on connector safety factors. In one or more embodiments, such a safety factor (SF) for a pipe connector may be based on a geometric relationship between different triaxial load points, e.g., as expressed by Equation (14):

$$SF=|OC|/|OA| \qquad (14)$$

where O is the point of origin of a radial line 620 representing a triaxial load that passes through load point A, and C is the point at which radial line 620 intercepts connection failure envelope 610.

Assuming the intercept point (C) in this example is located between two points (not shown) at coordinates $(F_i, \Delta P_i)$ and $(F_{i+1}, \Delta P_{i+1})$ on connection failure envelope 610, the geometric relationship may be used to define an analytical formula for calculating the safety factor, e.g., as expressed by Equation (15):

$$SF = \frac{\Delta P_{i+1} * F_i - F_{i+1} * \Delta P_i}{Pe(F_i - F_{i+1}) + F_{eq} * (\Delta P_{i+1} - \Delta P_i)} \quad (15)$$

where Feq is the equivalent axial load according to Equation (5) described above, Fa is the axial load, Pi is the internal pressure, Po is the external pressure, Pe is differential pressure (Pi-Po), $\Delta P_i$ is the input burst/collapse rating at axial force $F_i$, and i is any integer value from 1 to N-1, where N represents the total number of envelope points.

Figure 7:
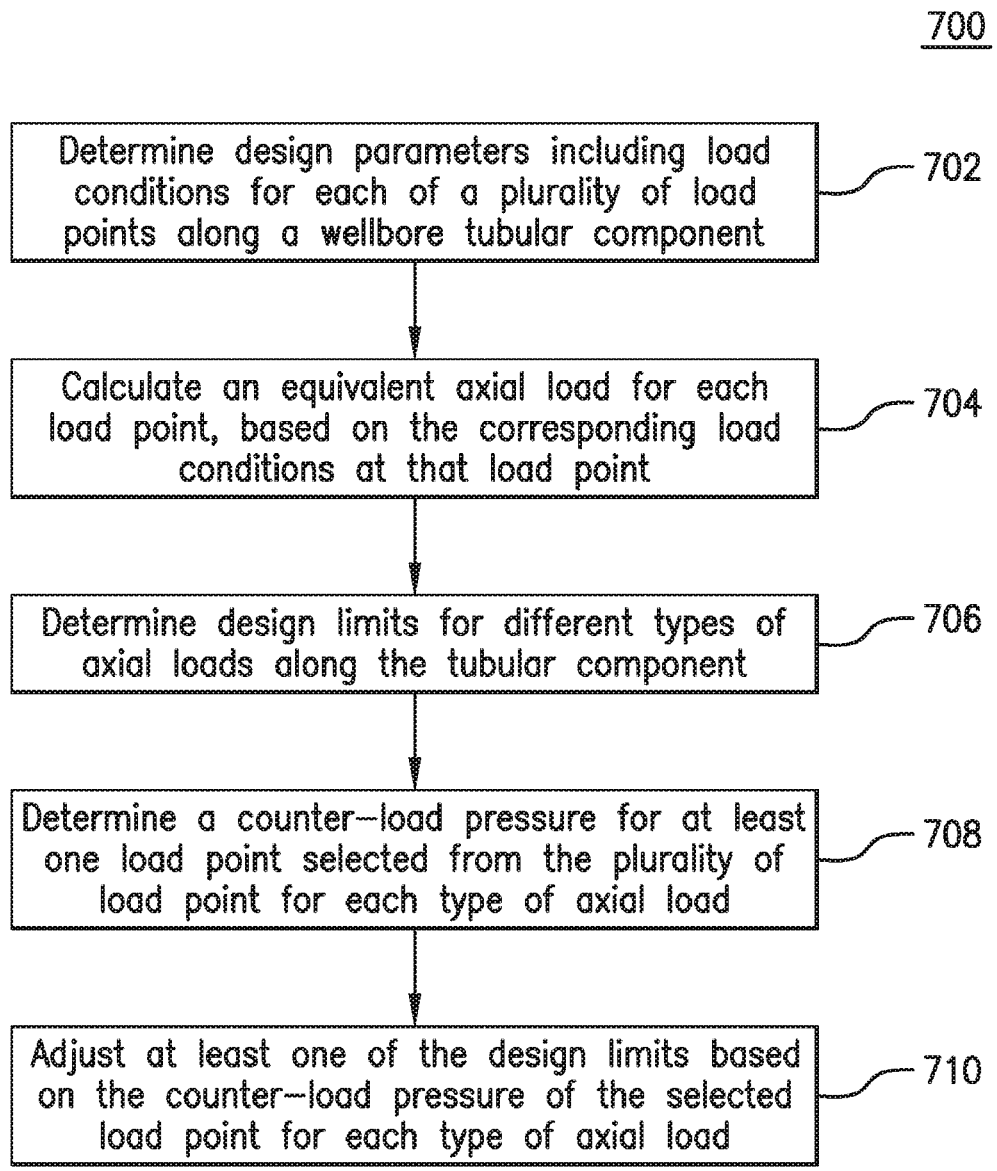
FIG. 7 is a flowchart of an illustrative process for optimizing wellbore tubular design.

FIG. 7 is a flowchart of an illustrative process 700 for optimizing wellbore tubular design. For example, process 700 may be used to optimize design limits for triaxial loads at load points along a tubular component of a wellbore. As described above, such design limits may be optimized by appropriately adjusting one or more default or baseline design limits for compressive and tensile loads along the tubular component. In one or more embodiments, the tubular component may correspond to a portion of a tubing string or a casing string along one or more sections of the wellbore. The portion of the tubing/casing string may be either a segment of a pipe (or pipe body) or a pipe connector between different pipe segments. For discussion purposes, process 700 will be described with reference to system 100 of FIG. 1, as described above. However, process 700 is not intended to be limited thereto.

Process 700 begins in block 702, which includes determining design parameters for a tubular component of a wellbore, based on different types of axial loads expected for the tubular component during a downhole operation to be performed. In one or more embodiments, the design parameters may include load conditions at each of a plurality of load points along the tubular component.

In block 704, an equivalent axial load for each load point is calculated based on the corresponding load conditions at that load point. For example, the equivalent axial load may be calculated using Equation (5), as described above. Also, as described above, the plurality of load points may be associated with a load scenario. The load scenario may be one of a plurality of load scenarios expected along the tubular component during the downhole operation. Each load scenario may be a combination of various design parameters associated with the tubular component.

Process 700 then proceeds to block 706, which includes determining design limits for the different types of axial loads along the tubular component of the wellbore, based on the design parameters associated with each type of axial load. The design limits may be based on the particular types of axial loads expected for the wellbore tubular design during the downhole operation. For example, the different types of axial loads may include compressive axial loads and tensile axial loads, and the design limits for these axial loads may include a compression limit and a tension limit, respectively, as described above.

In one or more embodiments, the design limits determined in block 706 may be initial (or initialized) limits to be adjusted or updated based on a counter-load pressure determined in block 708 for at least one load point selected from the plurality of load points for each type of axial load. Block 708 may include, for example, performing a search to find an appropriate value of the counter-load pressure at a selected load point for each type of axial load such that the corresponding equivalent axial load can be used to represent the design limit for that type of axial load within a design limit plot, e.g., design limit plot 400 of FIG. 4, as described above. Such a search may be performed using, for example, process 800 of FIG. 8, as will be described in further detail below.

Figure 8:
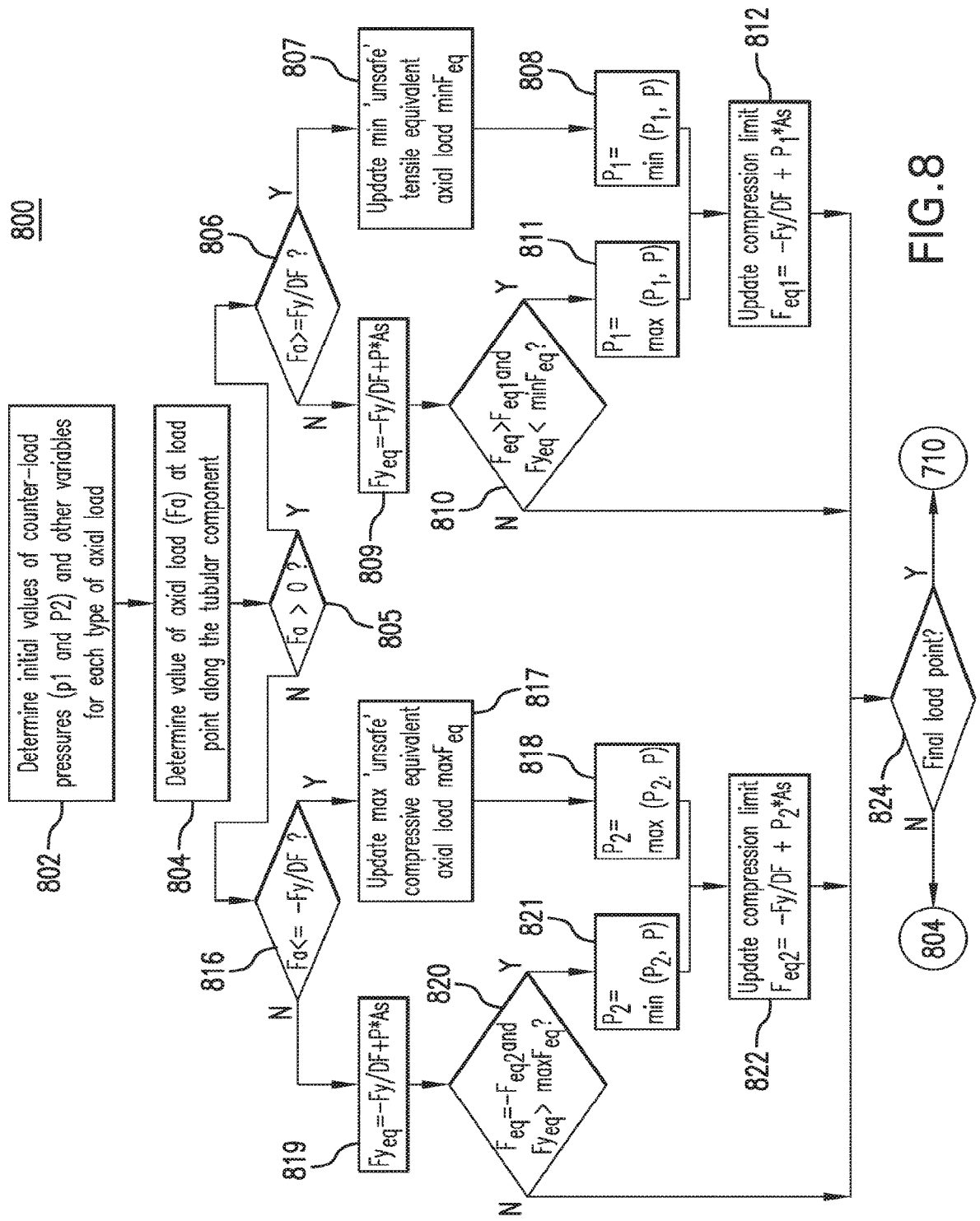
FIG. 8 is a flowchart of an illustrative process for finding appropriate counter-load pressure values for adjusting initial design limits.

FIG. 8 is a flowchart of an illustrative process 800 for finding appropriate counter-load pressure values that may be used to adjust initial design limits. For discussion purposes, process 800 will be described in the context of compression and tension limits for compressive and tensile axial loads along the tubular component. However, it should be appreciated that process 800 is not intended to be limited thereto and that process 800 may be applied to design limits for other types of loads. In some implementations, process 800 may represent a workflow for a search algorithm that may be used to find appropriate load points and corresponding counter-load pressure values for each type of axial load. The inputs of such an algorithm may include the load conditions at each of the plurality of load points along the tubular component along with other design parameters associated with the tubular component. Such other design parameters may include, but are not limited to, a cross-sectional area of the tubular component, an axial rating of the tubular component, and one or more design factors for the different types of axial loads. The workflow described herein may be part of an overall well planning and design workflow, including processes 700 and 800 of FIGS. 7 and 8, respectively, for optimizing the design of a wellbore tubular component. Such a workflow may be performed by, for example, well planner 110 of FIG. 1, as described above.

As shown in FIG. 8, process 800 begins in block 802, which includes determining initial values for the respective counter-load pressures (P1 and P2) and other variables for tensile and compressive axial loads. Such other variables may include, for example and without limitation, the initial compression and tension limits (e.g., as determined in block 706 of FIG. 7, as described above) in addition to a minimum compressive or tensile equivalent axial load (minFeq) associated with "unsafe" load points, i.e., those load points for which the compressive or tensile axial load exceeds design limits. In one or more embodiments, the determination of initial values in block 802 may involve initializing the counter-load pressure and other variables to predetermined or user-specified values. In the search algorithm example described above, the counter-load pressure and other variables may be represented by local static variables that are initialized and then updated as the workflow described herein is performed for each of the plurality of load points in an iterative manner.

In block 804, the value of the axial load (Fa) at a first of the plurality of load points along the tubular component may be determined. If the axial load is determined to be positive in block 805, this indicates that the axial load at the particular load point is a tensile axial load and process 800 proceeds to block 806. Block 806 includes determining whether the tensile axial load at this load point meets or exceeds the initial tension limit. The initial tension limit in this example may be a positive ratio between the axial rating (Fy) of the tubular component and a design factor (DF). Likewise, the initial compression limit may be a negative ratio between the axial rating and the design factor. While the same design factor is used for both tensile and compressive axial loads in this example, it should be appreciated that a different design factor may be used for each of these types of axial loads, e.g., as described above with respect to Equations (10) and (11).

If it is determined in block 806 that the axial load (Fa) at the current load point meets or exceeds the initial tension limit (Fy/DF), the load point may be considered "unsafe" and process 800 proceeds to blocks 807, 808 and 812. In block 807, the minimum "unsafe" tensile equivalent axial load is updated based on the equivalent axial load associated with the current load point. In block 808, the value of the counter-load pressure for the current load point is compared with the initial value of the counter-load pressure (P1) for tensile axial loads, as determined or initialized in block 802, and the minimum between these two values is selected as the value of P1 for tensile axial loads going forward. For example, if the current load point's counter-load pressure (minimum between an internal pressure value and an external pressure value at the load point) is determined to be less than the initial value of P1, the value of P1 is set to the counter-load pressure of the current load point. In block 812, the tension limit is updated or adjusted based on the current value of P1 and the cross-sectional area of the tubular component. As described above, such a pressure-adjusted tension limit may be set to a value of a tensile equivalent axial load (Feq1) determined based on the counter-load pressure (P1) and the cross-sectional area (As), e.g., as expressed by Equation (12) above.

Conversely, if it is determined in block 806 that the axial load (Fa) at the current load point is less than the initial tension limit (Fy/DF), the load point may be considered "safe" and process 800 proceeds to blocks 809 and 810. Block 809 includes estimating a value (Fyeq) of the tensile equivalent axial load representing the pressure-adjusted tension limit to be determined in block 812. As shown in FIG. 8, the Fyeq value in block 809 may be estimated using a similar formula or equation to that used in block 812, e.g., a variation of Equation (12) with the counter-load pressure (P) of the current load point replacing P1. The estimated value (Fyeq) for the to-be-determined tension limit is then used in block 810 to check whether any prior adjustment to the tension limit caused the current "safe" load point to fall outside of the tension limit boundaries or design limit envelope for tensile axial loads. For example, such an over-adjustment may exist in cases where the equivalent axial load (Feq) of the current load point is determined to be greater than the current or previously adjusted value of the tension limit (Feq1) and Fyeq is determined to be less than the minimum unsafe tensile equivalent axial load (minFeq). The value of the tension limit in this example may be the pressure-adjusted value (Feq1) as previously determined in block 812 based on a counter-load pressure of a prior unsafe load point, as described above. Likewise, the current value of minFeq in this example may be the updated value from block 807, e.g., the value of the equivalent axial load associated with the prior unsafe load point.

If such an over-adjustment is detected in block 810 (i.e., if Feq>Feq1 and Fyeq<minFeq), process 800 proceeds to block 811. Otherwise, process 800 proceeds directly to block 824, as will be described in further detail below. In block 811, the value of P1 is set to the maximum between the value of P1 and the counter-load pressure of the current "safe" load point. Process 800 then proceeds to block 812, in which the tension limit is updated or adjusted based on the current P1 value, which may be either the same as the previous value or a new value corresponding to the counter-load pressure of the current load point. If the counter-load pressure of the current load point were determined in block 811 to be greater than the previous or initial value of P1, the value of the pressure-adjusted tension limit (Feq1) in block 812 essentially becomes the estimated value (Fyeq) from block 809.

As shown in FIG. 8, a set of operations that are similar to those described above with respect to blocks 806-812 for points of tensile (or positive) axial load along the tubular component may be performed in blocks 816-822 for points of compressive (or negative) axial loads. Thus, if the axial load at a load point is determined to be negative in block 805, this indicates that the axial load at the particular load point is a compressive axial load and process 800 proceeds to blocks 816-822. The operations in blocks 816-822 may be performed in order to determine an appropriate counter-load pressure value (P2) for updating or adjusting the initial compression limit for compressive axial loads, based on an initial compression limit (−Fy/DF), a maximum "unsafe" compressive equivalent axial load (maxFeq) and an estimated value (Fyeq) of the to-be-determined compression limit (Feq2), as shown in FIG. 8.

Following either block 812 or block 822, process 800 proceeds to block 824, which includes determining whether the current (tensile or compressive) load point is the final load point to be processed in the plurality of load points along the tubular component. If there are additional load points, process 800 returns to blocks 804 and 805. The above-described operations in blocks 806-812 for tensile axial loads or similar operations in blocks 816-822 for compressive axial loads are then repeated for the next load point, depending on the type of axial load at that load point. Once the final load point has been processed and the counter-load pressure of a selected load point for each type of load (e.g., P1 and P2 for tensile and compressive axial loads) has been determined, process 800 ends and the workflow described herein may return to process 700 of FIG. 7 and particularly, block 710 of process 700, as shown in FIG. 8.

In block 710 of process 700, the counter-load pressures determined in block 708 (e.g., using process 800) is then used in block 710 to adjust at least one of the design limits for the different types of axial loads (e.g., at least one of the tension limit or the compression limit for the tensile and/or compressive axial loads) along the tubular component.

Although not shown in FIG. 7, it should be appreciated that process 700 may include any number of additional operations for optimizing the wellbore tubular design. Such additional operations may include, for example and without limitation, generating a visualization of the plurality of load points relative to the design limits for the different types of axial loads. In one or more embodiments, the visualization may be a 2D design limit plot of the plurality of load points along with the design limits for the different types of axial loads expected along the tubular component of the wellbore during the downhole operation, e.g., as shown in FIGS. 4-6 and described above. The visualization may be presented to a user via a GUI, e.g., GUI 130 of FIG. 1, as described above, displayed on a display of the user's computing device.

An example of applying the disclosed tubular design techniques to a wellbore casing design will now be described in reference to FIGS. 9-11B. However, it should be appreciated that the disclosed techniques are not intended to be limited to casing design and that these techniques may be applied to any of various tubular component designs. Also, while various assumptions will be made with respect to the types and configurations of tubular components in this example, it should be appreciated that such assumptions are made for purposes of discussion and explanation only and that the disclosed techniques may be applied to any of various types of wellbore configurations. Further, while this example is described in the context of tension and compression limits for respective tensile and compressive axial loads, it should be appreciated that the disclosed techniques may be applied to design limits for other types of loads.

Figure 9:
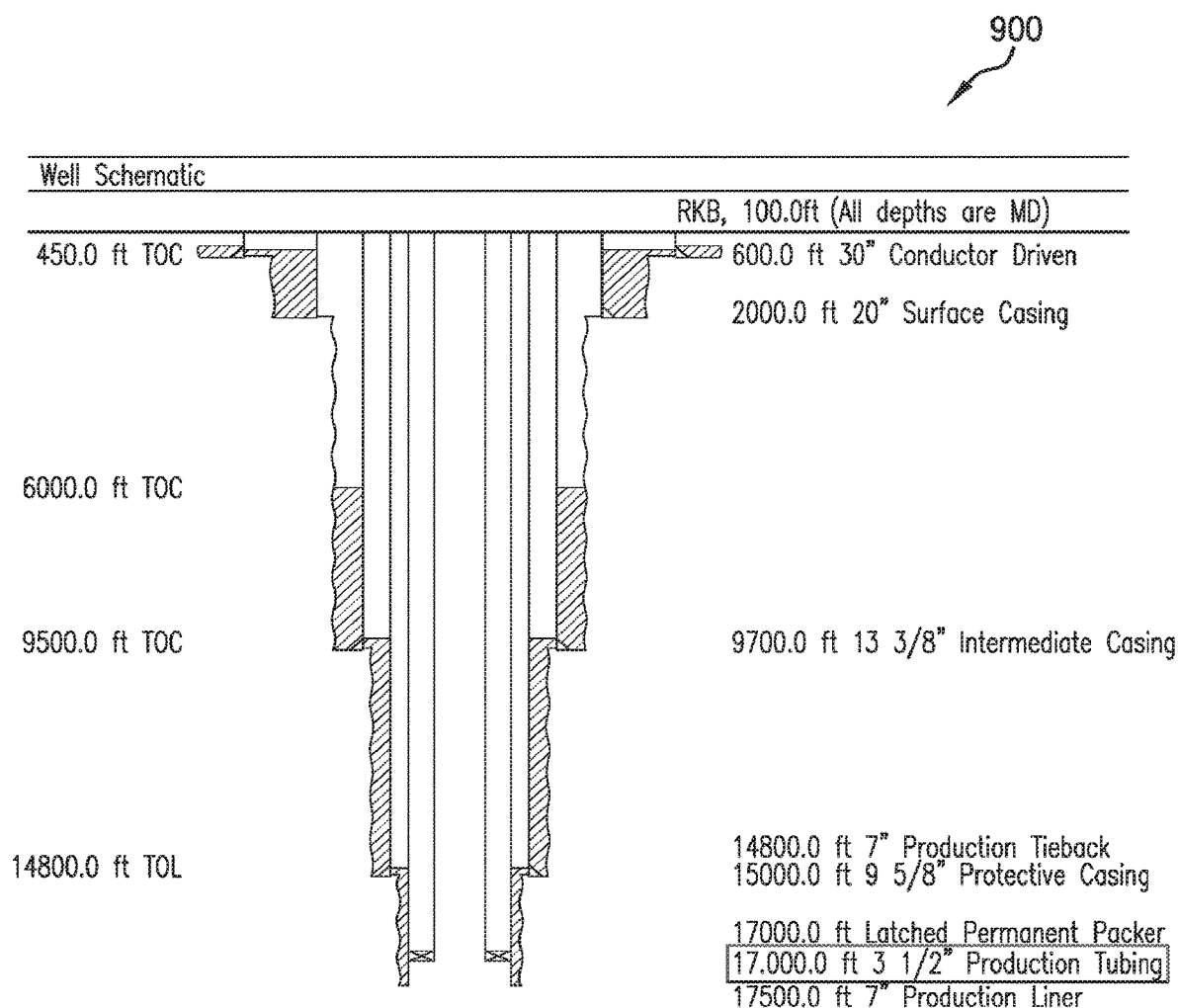
FIG. 9 is a schematic of an illustrative configuration of a wellbore including different types of tubular components.

FIG. 9 is a schematic of an illustrative configuration for a wellbore 900. As shown in FIG. 9, different types of tubular components may be disposed within wellbore 900. The tubular components may include, for example and without limitation, conductor casing, surface casing, intermediate casing, protective casing, production casing, and production tubing. The tubular components of wellbore 900 may be configured according to the geometric parameters and fluids listed in the following table:

TABLE

Wellbore geometric parameters and annulus fluids

| Name | Type | OD (in) | MD (ft) Hanger | TOC | Base | Hole Size (in) | Annulus Fluid |
|---|---|---|---|---|---|---|---|
| Conductor | Driven | 30.000 | 40.0 | | 600.0 | | |
| Surface | Casing | 20.000 | 40.0 | 450.0 | 2000.0 | 26.000 | Seawater |
| Intermediate | Casing | 13⅜ | 40.0 | 6000.0 | 9700.0 | 17½ | 10.0 ppg WBM |
| Protective | Casing | 9⅝ | 40.0 | 9500.0 | 15000.0 | 12¼ | 14.5 ppg OBM |
| Production | Liner | 7.000 | 14800.0 | 14800.0 | 17500.0 | 8½ | 17.5 ppg OBM |
| Production | Tieback | 7.000 | 40.0 | 14800.0 | 14800.0 | | 17.5 ppg WBM |
| Production | Tubing | 3½ | 40.0 | | 17000.0 | | 10.0 ppg CaCl2 |

Figure 10A:
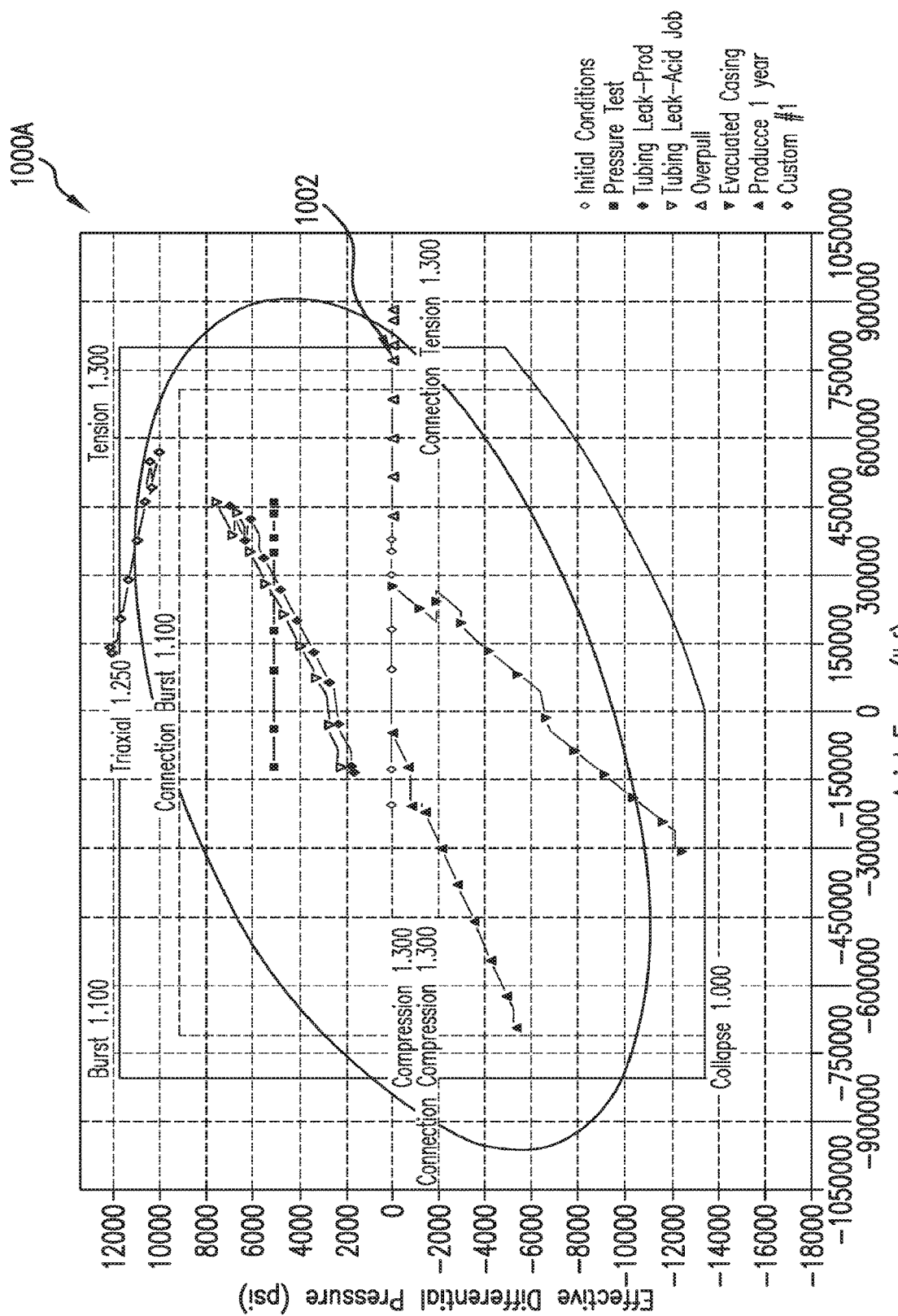
FIGS. 10A and 10B are design limit plots showing different visualizations of load points and design limits for a production tieback of the wellbore shown in FIG. 9.
Figure 10B:
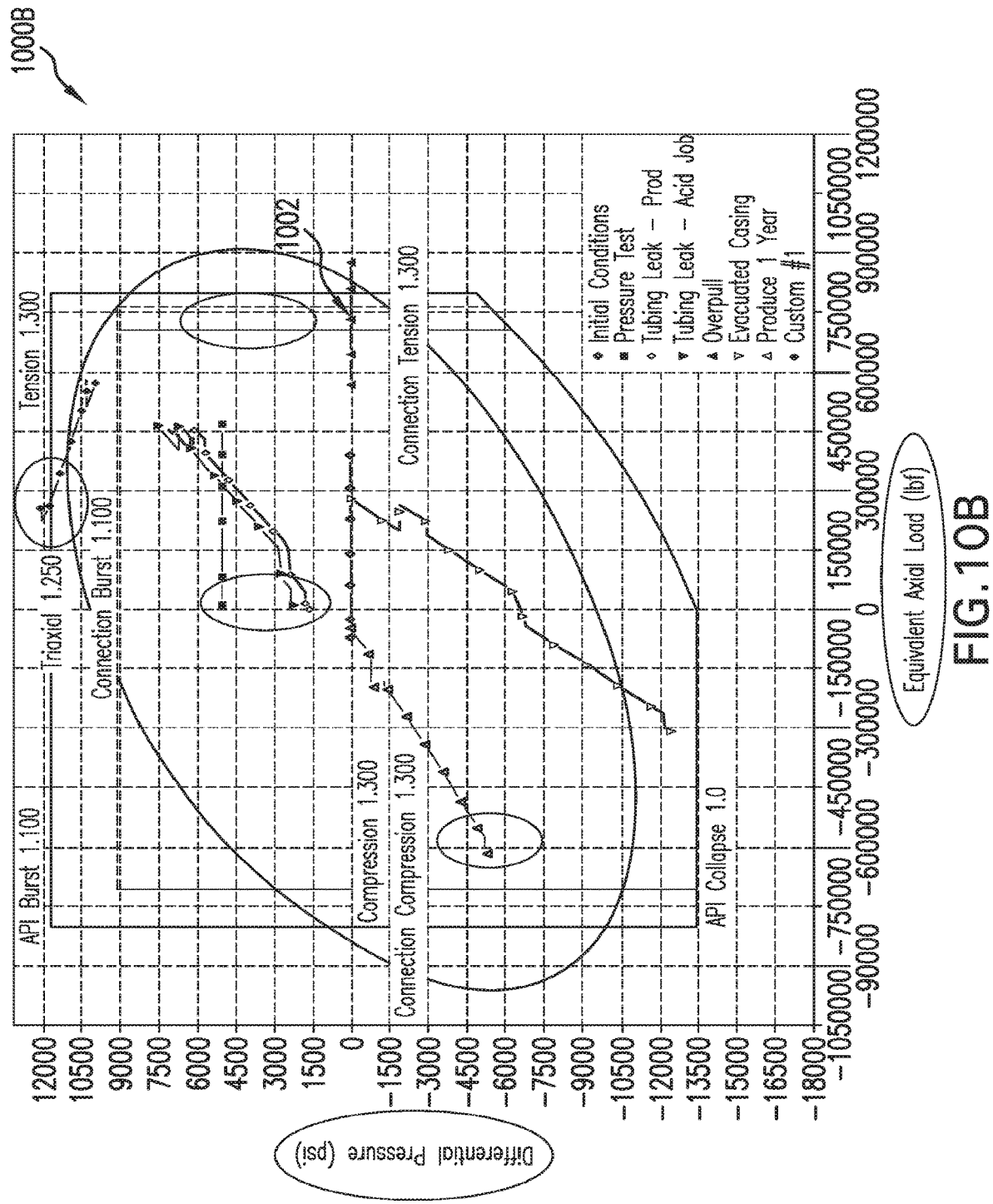

FIGS. 10A and 10B are design limit plots showing different visualizations of load points and design limits for the production tieback of wellbore 900 of FIG. 9, e.g., as configured according to the values in the Table above. In FIG. 10A, a design limit plot 1000A shows an example of a traditional visualization of the load points and design limits, in which axial load and effective differential pressure are used for the x-axis and y-axis of the plot, respectively. In FIG. 10B, a design limit plot 1000B shows an example of a visualization of the same load points and design limits according to the disclosed tubular design techniques, where differences relative to design limit plot 1000A are indicated by the oval-shaped areas shown in design limit plot 1000B. For example, in contrast with the design limit plot 1000A, equivalent axial load and differential pressure are used for the x-axis and y-axis of design limit plot 1000B. The shapes of yield envelopes and design limits as shown in each of design limit plots 1000A and 1000B are relatively similar. However, due to the additional counter-load pressure effects that are taken into account by plotting the equivalent axial load in design limit plot 1000B, the tension limit is shifted or adjusted in the positive direction along the x-axis (toward the right-hand side of the plot) as indicated by the dotted lines in FIG. 10B. The shifting or adjustment of the tension limit allows the visualization of the design limit plot to be calibrated such that any axially "safe" load points (e.g., load point 1002) located near the boundaries of the tension limit are correctly shown as being included within such boundaries rather than being excluded as an "unsafe" load point. The use of equivalent axial load and differential pressure in design limit plot 1000B also allows the load points to be plotted using a more refined scale, which improves the accuracy of the plot and allows more useful comparisons between nearby load points to be made.

Figure 11A:
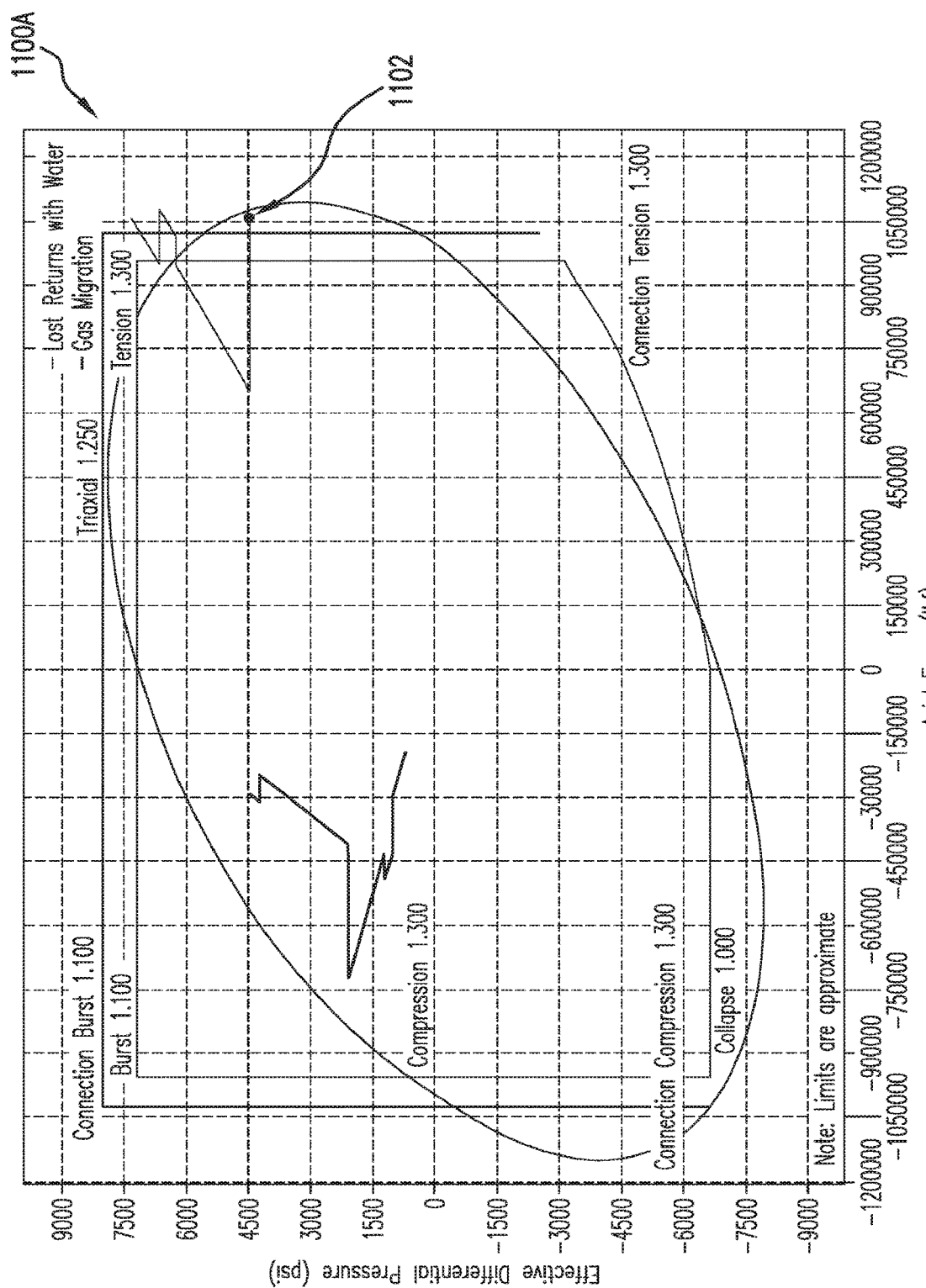
FIGS. 11A and 11B are plot graphs of illustrative load scenarios and design limits for a protective casing of the wellbore shown in FIG. 9.
Figure 11B:
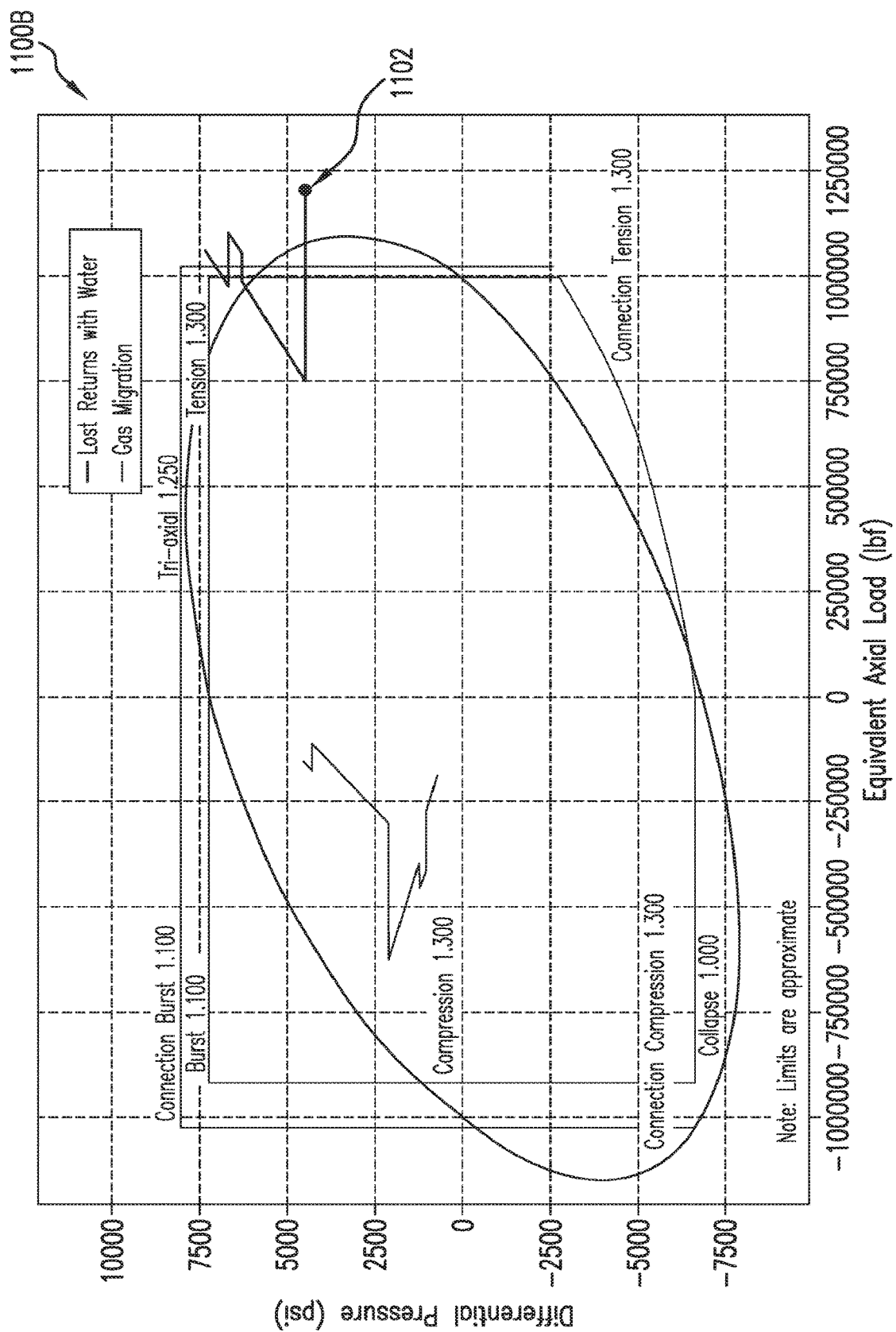

FIGS. 11A and 11B are design limit plots 1100A and 1100B, respectively, of illustrative load scenarios and design limits for the protective casing of wellbore 900 as shown in FIG. 9. Similar to the adjusted tension limit in design limit plot 1000B of FIG. 10B described above, the triaxial yield envelope in design limit plot 1100B is adjusted along the x-axis of the plot due to the additional counter-load pressure effects that are taken into account for the design limits visualized in design limit plot 1100B relative to design limit plot 1100A. Consequently, a known tri-axially "unsafe" load point 1102 is properly shown as being outside of the elliptical triaxial yield envelope shown in design limit plot 1100B, rather than being inside the envelope as in design limit plot 1100A.

Figure 12:
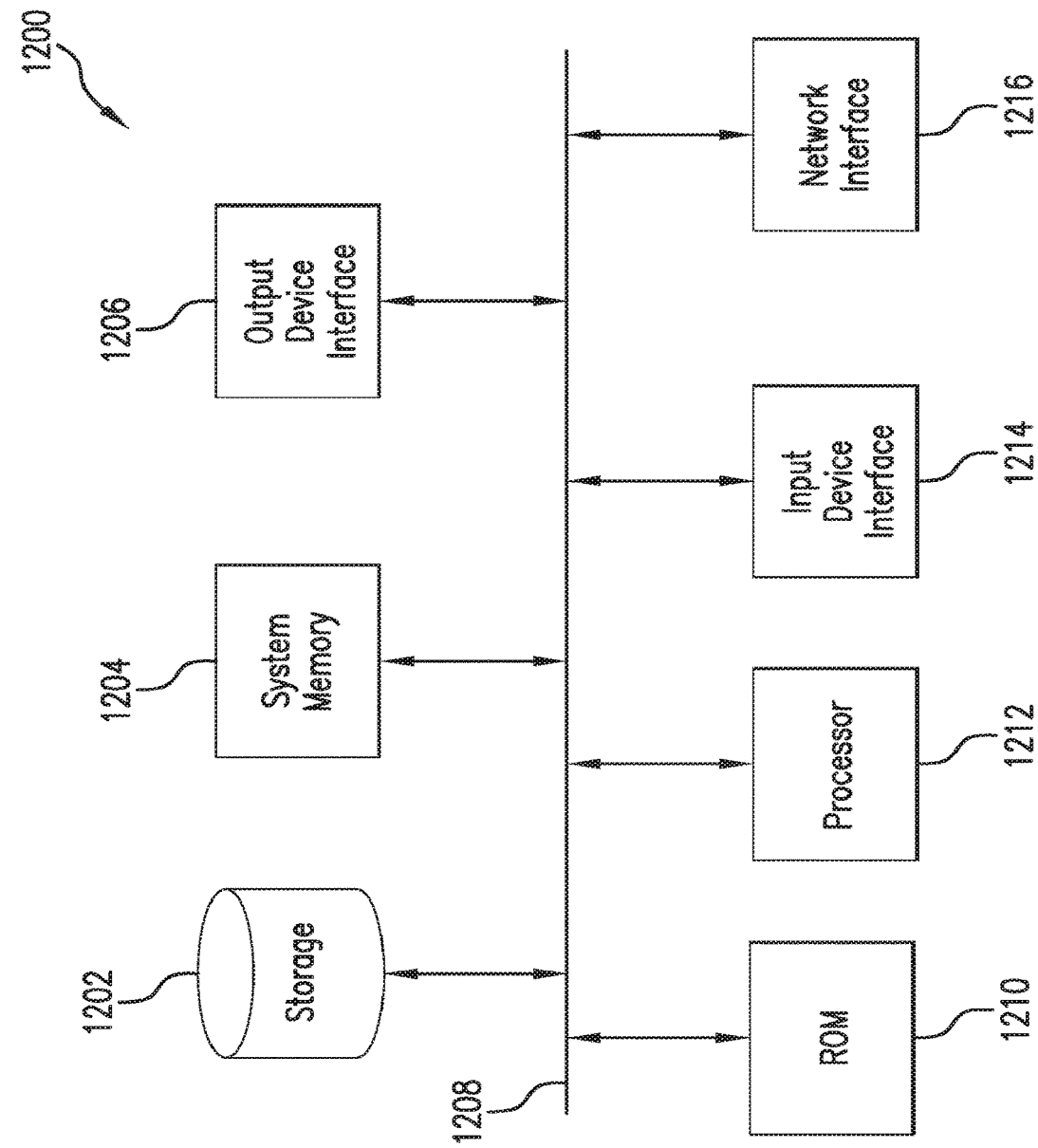
FIG. 12 is a block diagram illustrating an example of a computer system in which embodiments of the present disclosure may be implemented.

FIG. 12 is a block diagram illustrating an example of a computer system 1200 in which embodiments of the present disclosure may be implemented. For example, system 100 of FIG. 1, as described above, may be implemented using system 1200. Likewise, processes 700 and 800 of FIGS. 7 and 8, respectively, as described above, may be implemented using system 1200. System 1200 can be a computer, phone, PDA, or any other type of electronic device. Such an electronic device includes various types of computer readable media and interfaces for various other types of computer readable media. As shown in FIG. 12, system 1200 includes a permanent storage device 1202, a system memory 1204, an output device interface 1206, a system communications bus 1208, a read-only memory (ROM) 1210, processing unit(s) 1212, an input device interface 1214, and a network interface 1216.

Bus 1208 collectively represents all system, peripheral, and chipset buses that communicatively connect the numerous internal devices of system 1200. For instance, bus 1208 communicatively connects processing unit(s) 1212 with ROM 1210, system memory 1204, and permanent storage device 1202.

From these various memory units, processing unit(s) 1212 retrieves instructions to execute and data to process in order to execute the processes of the subject disclosure. The processing unit(s) can be a single processor or a multi-core processor in different implementations.

ROM 1210 stores static data and instructions that are needed by processing unit(s) 1212 and other modules of system 1200. Permanent storage device 1202, on the other hand, is a read-and-write memory device. This device is a non-volatile memory unit that stores instructions and data even when system 1200 is off. Some implementations of the subject disclosure use a mass-storage device (such as a magnetic or optical disk and its corresponding disk drive) as permanent storage device 1202.

Other implementations use a removable storage device (such as a floppy disk, flash drive, and its corresponding disk drive) as permanent storage device 1202. Like permanent storage device 1202, system memory 1204 is a read-and-write memory device. However, unlike storage device 1202, system memory 1204 is a volatile read-and-write memory, such a random access memory. System memory 1204 stores some of the instructions and data that the processor needs at runtime. In some implementations, the processes of the subject disclosure are stored in system memory 1204, permanent storage device 1202, and/or ROM 1210. For example, the various memory units include instructions for optimizing wellbore tubular design in accordance with embodiments of the present disclosure, e.g., according to processes 700 and 800 of FIGS. 7 and 8, respectively, as described above. From these various memory units, processing unit(s) 1212 retrieves instructions to execute and data to process in order to execute the processes of some implementations.

Bus 1208 also connects to input and output device interfaces 1214 and 1206. Input device interface 1214 enables the user to communicate information and select commands to the system 1200. Input devices used with input device interface 1214 include, for example, alphanumeric, QWERTY, or T9 keyboards, microphones, and pointing devices (also called "cursor control devices"). Output device interfaces 1206 enables, for example, the display of images generated by the system 1200. Output devices used with output device interface 1206 include, for example, printers and display devices, such as cathode ray tubes (CRT) or liquid crystal displays (LCD). Some implementations include devices such as a touchscreen that functions as both input and output devices. It should be appreciated that embodiments of the present disclosure may be implemented using a computer including any of various types of input and output devices for enabling interaction with a user. Such interaction may include feedback to or from the user in different forms of sensory feedback including, but not limited to, visual feedback, auditory feedback, or tactile feedback. Further, input from the user can be received in any form including, but not limited to, acoustic, speech, or tactile input. Additionally, interaction with the user may include transmitting and receiving different types of information, e.g., in the form of documents, to and from the user via the above-described interfaces.

Also, as shown in FIG. 12, bus 1208 also couples system 1200 to a public or private network (not shown) or combination of networks through a network interface 1216. Such a network may include, for example, a local area network ("LAN"), such as an Intranet, or a wide area network ("WAN"), such as the Internet. Any or all components of system 1200 can be used in conjunction with the subject disclosure.

These functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself. Accordingly, the operations performed in processes 700 and 800 of FIGS. 7 and 8, respectively, as described above, may be implemented using system 1200 or any computer system having processing circuitry or a computer program product including instructions stored therein, which, when executed by at least one processor, causes the processor to perform functions relating to these methods.

As used in this specification and any claims of this application, the terms "computer", "server", "processor", and "memory" all refer to electronic or other technological devices. These terms exclude people or groups of people. As used herein, the terms "computer readable medium" and "computer readable media" refer generally to tangible, physical, and non-transitory electronic storage mediums that store information in a form that is readable by a computer.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., a web page) to a client device (e.g., for purposes of displaying data to and receiving user input from a user interacting with the client device). Data generated at the client device (e.g., a result of the user interaction) can be received from the client device at the server.

It is understood that any specific order or hierarchy of steps in the processes disclosed is an illustration of exemplary approaches. Based upon design preferences, it is understood that the specific order or hierarchy of steps in the processes may be rearranged, or that all illustrated steps be performed. Some of the steps may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Furthermore, the exemplary methodologies described herein may be implemented by a system including processing circuitry or a computer program product including instructions which, when executed by at least one processor, causes the processor to perform any of the methodology described herein.

As described above, embodiments of the present disclosure are particularly useful for optimizing wellbore tubular designs. Advantages of the present disclosure include, but are not limited to, providing better consistency between triaxial design limits with both the von Mises triaxial yield criterion and the API 5C3 2015 addendum. By visualizing load points and design limits based on equivalent axial load and counter-load pressure, the design limit plots generated according to disclosed techniques not only provide a more accurate representation of safety factors for a wellbore tubular design, but also facilitate direct readings of burst and/or collapse ratings for such a design.

In one embodiment of the present disclosure, a method of optimizing wellbore tubular design includes: determining design parameters for a tubular component of a wellbore, based on different types of axial loads expected for the tubular component during a downhole operation to be performed, the design parameters including load conditions at each of a plurality of load points along the tubular component; calculating an equivalent axial load for each load point, based on the corresponding load conditions at that load point; determining design limits (e.g., a compression limit and a tension limit) for the different types of axial loads along the tubular component of the wellbore, based on the design parameters associated with each type of axial load; determining a counter-load pressure for at least one load point selected from the plurality of loads points for each type of axial load, based on the corresponding equivalent axial load for each load point and a corresponding design limit for each type of axial load; and adjusting at least one of the design limits for the different types of axial loads along the tubular component, based on the counter-load pressure of the selected load point for each type of axial load. Also, a computer-readable storage medium having instructions stored therein is disclosed, where the instructions, when executed by a computer, cause the computer to perform a plurality of functions, including functions to: determine load conditions for each of a plurality of load points along a tubular component of a wellbore; calculate an equivalent axial load for each load point, based on the corresponding load conditions at that load point, initialize a compression limit and a tension limit for different types of axial loads along the tubular component of the wellbore, based on design parameters associated with the tubular component; identify load points in the plurality of load points for which the corresponding axial loads exceed at least one of the compression limit or the tension limit for each of the different types of axial loads; select at least one of the identified load points for which the equivalent axial load is determined to be closest to at least one of the compression limit or the tension limit; determine a counter-load pressure for a cross-sectional area of the tubular component at the selected load point; and adjust at least one of the tension limit or the compression limit based on the counter-load pressure at the selected load point.

One or more embodiments of the foregoing method and/or computer-readable storage medium may further include any one or any combination of the following additional elements, functions or operations: generating a visualization of the load points and design limits for the different types of axial loads, where the visualization may be a two-dimensional (2D) design limit plot; the plurality of load points may be associated with a load scenario, where the load scenario is one of a plurality of load scenarios expected along the tubular component during the downhole operation and each load scenario is a combination of various design parameters associated with the tubular component; the load conditions include an axial load, an internal pressure, and an external pressure for each of the plurality of load points; the different types of axial loads include compressive axial loads and tensile axial loads, the design parameters may further include a cross-sectional area of the tubular component, an axial rating of the tubular component, and one or more design factors for the different types of axial loads; the one or more design factors may include an axial compression design factor and an axial tension design factor; determining the counter-load pressure may include determining an initial value for the counter-load pressure at each of the plurality of load points, based on the internal pressure and the external pressure for the cross-sectional area of the tubular component of the wellbore corresponding to that load point, identifying load points in the plurality of load points for which the corresponding axial loads exceed at least one of the compression limit or the tension limit for each type of axial load, selecting at least one of the identified load points for each type of axial load based on a relative distance between the corresponding equivalent axial load of each load point and at least one of the compression limit or the tension limit, and updating the initial value of the counter-load pressure at the selected load point for each type of axial load based on the corresponding equivalent axial load and the compression and tension limits for the plurality of load points; the initial value of the counter-load pressure at each load point is a minimum of the internal and external pressures for the corresponding cross-sectional area of the tubular section of the wellbore; the selected load point is at least one of the identified load points for which the corresponding equivalent axial load is determined to be closest to at least one of the compression limit or the tension limit; and optimizing the wellbore tubular design further includes adjusting one or more of the design parameters such that all load points are within the design limits for the different types of axial loads expected along the tubular component of the wellbore during the downhole operation.

Furthermore, a system is described, where the system includes at least one processor and a memory coupled to the processor having instructions stored therein, which when executed by the processor, cause the processor to perform functions including functions to: determine design parameters for a tubular component of a wellbore, based on different types of axial loads expected for the tubular component during a downhole operation to be performed, the design parameters including load conditions at each of a plurality of load points along the tubular component; calculate an equivalent axial load for each load point, based on the corresponding load conditions at that load point; determine design limits for the different types of axial loads along the tubular component of the wellbore, based on the design parameters associated with each type of axial load; determine a counter-load pressure for at least one load point selected from the plurality of loads points for each type of axial load, based on the corresponding equivalent axial load for each load point and a corresponding design limit for each type of axial load; and adjust at least one of the design limits for the different types of axial loads along the tubular component, based on the counter-load pressure of the selected load point for each type of axial load.

One or more embodiments of the foregoing system may further include any one or any combination of the following additional elements, functions or operations: generating a visualization of the load points and design limits for the different types of axial loads, where the visualization may be a two-dimensional (2D) design limit plot; the plurality of load points may be associated with a load scenario, where the load scenario is one of a plurality of load scenarios expected along the tubular component during the downhole operation and each load scenario is a combination of various design parameters associated with the tubular component; the load conditions include an axial load, an internal pressure, and an external pressure for each of the plurality of load points; the different types of axial loads include compressive axial loads and tensile axial loads; the design limits include a compression limit and a tension limit; the design parameters may further include a cross-sectional area of the tubular component, an axial rating of the tubular component, and one or more design factors for the different types of axial loads; the one or more design factors may include an axial compression design factor and an axial tension design factor; determining the counter-load pressure may include determining an initial value for the counter-load pressure at each of the plurality of load points, based on the internal pressure and the external pressure for the cross-sectional area of the tubular component of the wellbore corresponding to that load point, identifying load points in the plurality of load points for which the corresponding axial loads exceed at least one of the compression limit or the tension limit for each type of axial load, selecting at least one of the identified load points for each type of axial load based on a relative distance between the corresponding equivalent axial load of each load point and at least one of the compression limit or the tension limit, and updating the initial value of the counter-load pressure at the selected load point for each type of axial load based on the corresponding equivalent axial load and the compression and tension limits for the plurality of load points, the initial value of the counter-load pressure at each load point is a minimum of the internal and external pressures for the corresponding cross-sectional area of the tubular section of the wellbore; the selected load point is at least one of the identified load points for which the corresponding equivalent axial load is determined to be closest to at least one of the compression limit or the tension limit; and optimizing the wellbore tubular design further includes adjusting one or more of the design parameters such that all load points are within the design limits for the different types of axial loads expected along the tubular component of the wellbore during the downhole operation.

While specific details about the above embodiments have been described, the above hardware and software descriptions are intended merely as example embodiments and are not intended to limit the structure or implementation of the disclosed embodiments. For instance, although many other internal components of the system 1200 are not shown, those of ordinary skill in the art will appreciate that such components and their interconnection are well known.

In addition, certain aspects of the disclosed embodiments, as outlined above, may be embodied in software that is executed using one or more processing units/components. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives, optical or magnetic disks, and the like, which may provide storage at any time for the software programming.

Additionally, the flowchart and block diagrams in the figures illustrate the architecture, functionality, and operation of possible implementations of systems, methods and computer program products according to various embodiments of the present disclosure. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The above specific example embodiments are not intended to limit the scope of the claims. The example embodiments may be modified by including, excluding, or combining one or more features or functions described in the disclosure.

As used herein, the singular forms "a", "an" and "the" are intended to include the plural forms as well, unless the context clearly indicates otherwise. It will be further understood that the terms "comprise" and/or "comprising," when used in this specification and/or the claims, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the embodiments in the form disclosed. Many modifications and variations will be apparent to those of ordinary skill in the art without departing from the scope and spirit of the disclosure. The illustrative embodiments described herein are provided to explain the principles of the disclosure and the practical application thereof, and to enable others of ordinary skill in the art to understand that the disclosed embodiments may be modified as desired for a particular implementation or use. The scope of the claims is intended to broadly cover the disclosed embodiments and any such modification.

What is claimed is:

1. A computer-implemented method of optimizing wellbore tubular design for downhole operations, the method comprising:

determining, by a computing device, design parameters for a tubular component along a current section of a wellbore within a subsurface formation, based on different types of axial loads expected for the tubular component during a downhole operation to be performed along different sections of the wellbore, the design parameters including load conditions expected for each type of axial load at each of a plurality of load points along the tubular component, and the load conditions including an internal pressure and an external pressure for each of the plurality of load points;

calculating, by the computing device, an equivalent axial load for each load point, based on the corresponding load conditions at that load point;

determining, by the computing device, design limits for the different types of axial loads expected along the tubular component of the wellbore, based on the load conditions expected for each type of axial load, the design limits including a compression limit and a tension limit;

generating, by the computing device for display to a user via a graphical user interface (GUI) of the computing device, a visualization of the design limits for each type of axial load expected for the tubular component relative to the load conditions expected for the plurality of load points during the downhole operation along the current section of the wellbore;

determining, by the computing device, an initial value of a counter-load pressure at each of the plurality of load points along the tubular component for each type of axial load, based on the internal pressure and the external pressure for a cross-sectional area of the tubular component corresponding to that load point;

comparing, by the computing device, the design limits for each type of axial load to actual load conditions experienced at each of the plurality of load points during the downhole operation;

automatically updating the visualization, as displayed via the GUI, to indicate one or more of the load points as unsafe load points when the actual load conditions at the one or more load points are determined to exceed at least one of the compression limit or the tension limit for each type of axial load, based on the comparison;

selecting, by the computing device for each type of axial load, at least one of the unsafe load points, based on a relative distance between the corresponding equivalent axial load calculated for each of the unsafe load points and at least one of the compression limit or the tension limit;

updating, by the computing device, the load conditions expected for each type of axial load along the tubular component by updating the initial value of the counter-load pressure at the at least one unsafe load point selected for that type of axial load, based on the corresponding equivalent axial load and the compression and tension limits for the plurality of load points;

adjusting, by the computing device, at least one of the design limits for the different types of axial loads to account for the load conditions expected for the tubular component during the downhole operation to be performed along one or more subsequent sections of the wellbore, based on the updated value of the counter-load pressure at the at least one unsafe load point selected for each type of axial load; and performing the downhole operation along the one or more subsequent sections of the wellbore within the subsurface formation, based on the adjustment to the at least one design limit of the tubular component.

2. The method of claim 1, further comprising:
receiving, by the computing device via the GUI, input from the user selecting one of a plurality of views for displaying the visualization.

3. The method of claim 2, wherein the visualization is a two-dimensional (2D) design limit plot.

4. The method of claim 1, wherein the plurality of load points are associated with a load scenario, the load scenario is one of a plurality of load scenarios expected along the tubular component during the downhole operation, and each load scenario is a combination of various design parameters associated with the tubular component.

5. The method of claim 1, wherein the load conditions further include torque and bending momentum at each of the plurality of load points.

6. The method of claim 1, wherein the different types of axial loads include compressive axial loads and tensile axial loads.

7. The method of claim 6, wherein the design parameters further include an axial rating of the tubular component, and one or more design factors for the different types of axial loads.

8. The method of claim 7, wherein the one or more design factors include an axial compression design factor and an axial tension design factor.

9. The method of claim 1, wherein the initial value of the counter-load pressure at each load point is a minimum of the internal and external pressures for the corresponding cross-sectional area of the tubular component.

10. The method of claim 1, wherein the at least one unsafe load point selected for each type of axial load is at least one load point for which the corresponding equivalent axial load is determined to be closest to at least one of the compression limit or the tension limit.

11. The method of claim 1, further comprising:
adjusting one or more of the design parameters such that all load points are within the design limits for the different types of axial loads expected along the tubular component of the wellbore during the downhole operation.

12. A system comprising:
at least one processor; and
a memory coupled to the at least one processor, the memory having instructions stored therein, which when executed by the at least one processor, cause the at least one processor to perform a plurality of functions, including functions to:
determine design parameters for a tubular component along a current section of a wellbore within a subsurface formation, based on different types of axial loads expected for the tubular component during a downhole operation to be performed along different sections of the wellbore, the design parameters including load conditions expected for each type of axial load at each of a plurality of load points along the tubular component, and the load conditions including an internal pressure and an external pressure for each of the plurality of load points;
calculate an equivalent axial load for each load point, based on the corresponding load conditions at that load point;

determine design limits for the different types of axial loads expected along the tubular component of the wellbore, based on the design parameters associated with load conditions expected for each type of axial load, the design limits including a compression limit and a tension limit;

generate, for display to a user via a graphical user interface (GUI), a visualization of the design limits for each type of axial load expected for the tubular component relative to the load conditions expected for the plurality of load points during the downhole operation along the current section of the wellbore;

determine an initial value of a counter-load pressure at each of the plurality of load points along the tubular component for each type of axial load, based on the internal pressure and the external pressure for a cross-sectional area of the tubular component corresponding to that load point;

compare the design limits for each type of axial load to actual load conditions experienced at each of the plurality of load points during the downhole operation;

automatically updating the visualization, as displayed via the GUI, to indicate one or more of the load points as unsafe load points when the actual load conditions at the one or more load points are determined to exceed at least one of the compression limit or the tension limit for each type of axial load, based on the comparison;

select, for each type of axial load, at least one of the unsafe load points, based on a relative distance between the corresponding equivalent axial load calculated for each of the unsafe load points and at least one of the compression limit or the tension limit;

update the load conditions expected for each type of axial load along the tubular component by updating the initial value of the counter-load pressure at the at least one unsafe load point selected for that type of axial load, based on the corresponding equivalent axial load and the compression and tension limits for the plurality of load points; and adjust at least one of the design limits for the different types of axial loads to account for the load conditions expected for the tubular component during the downhole operation to be performed along one or more subsequent sections of the wellbore, based on the updated value of the counter-load pressure at the at least one unsafe load point selected for each type of axial load, wherein the downhole operation is performed along the one or more subsequent sections of the wellbore within the subsurface formation, based on the adjustment to the at least one design limit of the tubular component.

13. The system of claim 12, wherein the functions performed by the at least one processor further include functions to:
receive, via the GUI, input from the user selecting one of a plurality of views for displaying the visualization, wherein the visualization is a two-dimensional (2D) design limit plot.

14. The system of claim 12, wherein:
the load conditions further include torque and bending momentum at each of the plurality of load points; and
the different types of axial loads include compressive axial loads and tensile axial loads.

15. The system of claim 14, wherein the design parameters further include an axial rating of the tubular component, and one or more design factors for the compressive and tensile axial loads.

16. The system of claim 12, wherein the initial value of the counter-load pressure at each load point is a minimum of the internal and external pressures for the corresponding cross-sectional area of the tubular component, and the at least one unsafe load point selected for each type of axial load is at least one load point of the identified for which the corresponding equivalent axial load is determined to be closest to at least one of the compression limit or the tension limit.

17. The system of claim 12, wherein the functions performed by the at least one processor further include functions to:
adjust one or more of the design parameters such that all load points are within the design limits for the different types of axial loads expected along the tubular component of the wellbore during the downhole operation.

18. A non-transitory computer-readable storage medium having instructions stored therein, which, when executed by a computer, cause the computer to perform a plurality of functions, including functions to:
determine design parameters for a tubular component along a current section of a wellbore within a subsurface formation, based on different types of axial loads expected for the tubular component during a downhole operation to be performed along different sections of the wellbore, the design parameters including load conditions expected for each type of axial load at each of a plurality of load points along the tubular component, and the load conditions including an internal pressure and an external pressure for each of the plurality of load points;

calculate an equivalent axial load for each load point, based on the corresponding load conditions at that load point;

determine design limits for the different types of axial loads expected along the tubular component of the wellbore, based on the load conditions expected for each type of axial load expected for the tubular component, the design limits including a compression limit and a tension limit;

generate, for display to a user via a graphical user interface (GUI), a visualization of the design limits for each type of axial load expected for the tubular component relative to the load conditions expected for the plurality of load points during the downhole operation along the current section of the wellbore;

determine an initial value of a counter-load pressure at each of the plurality of load points along the tubular component for each type of axial load, based on the internal pressure and the external pressure for a cross-sectional area of the tubular component corresponding to that load point;

compare the design limits for each type of axial load to actual load conditions experienced at each of the plurality of load points during the downhole operation;

automatically update the visualization, as displayed via the GUI, to indicate one or more of the load points as unsafe load points when the actual load conditions at the one or more load points are determined to exceed at least one of the compression limit or the tension limit for each of the different types of axial loads, based on the comparison;

select, for each type of axial load, at least one of the unsafe load points for which the corresponding equivalent axial load is determined to be closest to at least one of the compression limit or the tension limit;

update the load conditions expected for each type of axial load along the tubular component by updating the initial value of the counter-load pressure at the at least one unsafe load point selected for that type of axial load, based on the corresponding equivalent axial load and the compression and tension limits for the plurality of load points; and adjust at least one of the tension limit or the compression limit for the different types of axial loads to account for the load conditions expected for the tubular component during the downhole operation to be performed along one or more subsequent sections of the wellbore, based on the updated value of the counter-load pressure at the at least one unsafe load point selected for each type of axial load, wherein the downhole operation is performed along the one or more subsequent sections of the wellbore within the subsurface formation, based on the adjustment to the at least one design limit of the tubular component.

* * * * *